United States Patent
Tsai et al.

(10) Patent No.: US 10,069,578 B2
(45) Date of Patent: Sep. 4, 2018

(54) RF TESTING SYSTEM WITH PARALLELIZED PROCESSING

(71) Applicant: MediaTek Inc., Hsin-Chu (TW)

(72) Inventors: Chung-Chin Tsai, Taichung (TW); Chun-Hsien Peng, Xinyi Township, Nantou County (TW)

(73) Assignee: MEDIATEK INC., Hsin-Chu (TW)

( * ) Notice: Subject to any disclaimer, the term of this patent is extended or adjusted under 35 U.S.C. 154(b) by 50 days.

(21) Appl. No.: 15/071,513

(22) Filed: Mar. 16, 2016

(65) Prior Publication Data

US 2016/0197685 A1 Jul. 7, 2016

Related U.S. Application Data

(63) Continuation-in-part of application No. 14/696,807, filed on Apr. 27, 2015, which is a continuation-in-part of application No. 14/054,213, filed on Oct. 15, 2013, now abandoned, and a continuation-in-part of application No. 13/480,969, filed on May 25, 2012, now Pat. No. 9,041,421.

(60) Provisional application No. 61/731,845, filed on Nov. 30, 2012, provisional application No. 61/496,451, filed on Jun. 13, 2011, provisional application No. 62/135,325, filed on Mar. 19, 2015.

(51) Int. Cl.
*H04B 17/17* (2015.01)
*H04B 17/00* (2015.01)
*H04B 17/29* (2015.01)

(52) U.S. Cl.
CPC ......... *H04B 17/17* (2015.01); *H04B 17/0085* (2013.01); *H04B 17/29* (2015.01)

(58) Field of Classification Search
CPC ..... H04B 17/17; H04B 17/29; H04B 17/0085
See application file for complete search history.

(56) References Cited

U.S. PATENT DOCUMENTS

| | | | |
|---|---|---|---|
| 6,201,829 B1 | 3/2001 | Schneider | |
| 6,543,034 B1 | 4/2003 | Goff et al. | |
| 7,184,466 B1 | 2/2007 | Seemann et al. | |
| 7,675,309 B2 | 3/2010 | Wu et al. | |
| 7,679,391 B2 | 3/2010 | Watanabe et al. | |

(Continued)

FOREIGN PATENT DOCUMENTS

| | | |
|---|---|---|
| CN | 1354503 A | 6/2002 |
| CN | 1805296 A | 7/2006 |

(Continued)

OTHER PUBLICATIONS

Kore, I., et al.; "Multi-Site Test of RF Transceivers on Low-Cost Digital ATE;" International Test Conference; IEEE; 2006; pp. 1-10.

(Continued)

*Primary Examiner* — Duc C Ho
(74) *Attorney, Agent, or Firm* — McClure, Qualey & Rodack, LLP

(57) ABSTRACT

An integrated circuit (IC) is provided. The IC includes: an RF transmitter configured to generate an RF signal when the IC has entered a test mode; an RF receiver configured to receive the RF signal in the test mode; and a computation unit having a plurality of processing units that are parallelized to perform a test procedure of the IC according to the received RF signal to determine one or more test results.

18 Claims, 26 Drawing Sheets

(56) References Cited

U.S. PATENT DOCUMENTS

| | | |
|---|---|---|
| 2004/0243899 A1 | 12/2004 | Bonneau et al. |
| 2004/0246337 A1* | 12/2004 | Hasegawa ........ G01R 31/31853 348/189 |
| 2005/0079822 A1 | 4/2005 | Boose et al. |
| 2006/0059450 A1* | 3/2006 | Lin .................... G06F 11/27 716/116 |
| 2006/0186983 A1* | 8/2006 | Ding ................ H01F 17/0006 336/232 |
| 2007/0096759 A1* | 5/2007 | Weinraub ........... G01R 31/3167 324/756.01 |
| 2007/0232240 A1 | 10/2007 | Wu et al. |
| 2007/0297537 A1 | 12/2007 | Luce |
| 2009/0201039 A1 | 8/2009 | Wu et al. |
| 2010/0007366 A1 | 1/2010 | Watanabe et al. |
| 2010/0095168 A1* | 4/2010 | Jeddeloh ................ G11C 5/02 714/720 |
| 2010/0227574 A1 | 9/2010 | Kuenen et al. |
| 2010/0232489 A1 | 9/2010 | Watkins |
| 2011/0006794 A1* | 1/2011 | Sellathamby ...... G01R 31/3025 324/754.03 |
| 2012/0126821 A1 | 5/2012 | Forstner |
| 2014/0187170 A1 | 7/2014 | Forstner |
| 2016/0041221 A1 | 2/2016 | Forstner |

FOREIGN PATENT DOCUMENTS

| | | |
|---|---|---|
| CN | 101304542 A | 11/2008 |
| CN | 101374317 | 2/2009 |
| CN | 101453279 A | 6/2009 |
| CN | 101464491 | 6/2009 |
| CN | 101753227 | 6/2010 |
| CN | 101784904 | 7/2010 |
| CN | 102089669 | 6/2011 |
| CN | 102495353 | 6/2012 |
| CN | 102540052 | 7/2012 |
| CN | 103077731 A | 5/2013 |
| CN | 103376757 A | 10/2013 |
| DE | 102011086818 | 5/2012 |
| JP | 2008151718 | 7/2008 |
| TW | 201038956 | 11/2010 |
| WO | WO 2006/113460 | 10/2006 |
| WO | WO 2009/022313 | 2/2009 |
| WO | WO 2010/004751 | 1/2010 |
| WO | WO 2010/049853 | 5/2010 |

OTHER PUBLICATIONS

Erdogan, E.S., et al.; "Detailed Characterization of Transceiver Parameters;" IEEE Transactions on Very Large Scal Integrating (VLSI) Systems; vol. 18; No. 6; Jun. 2010; pp. 1-11.

Berger, R.W., et al.; "Part IV: Product and Process Control;" The Certified Quality Engineer Handbook; 2008; pp. 209-211.

English language translation of "Part IV: Product and Process Control;" The Certified Quality Engineer Handbook; 2008; pp. 209-211.

* cited by examiner

RF TESTING SYSTEM WITH PARALLELIZED PROCESSING

CROSS REFERENCE TO RELATED APPLICATIONS

This application claims the benefit of U.S. Provisional Application No. 62/135,325, filed on Mar. 19, 2015. This application is also a Continuation-In-Part of application Ser. No. 14/696,807, filed on Apr. 27, 2015, which is a Continuation of U.S. patent application Ser. No. 14/054,213, filed on Oct. 15, 2013, which claims benefit of U.S. Provisional Application No. 61/731,845, filed on Nov. 30, 2012. Application Ser. No. 14/696,807 is also a Continuation-In-Part of U.S. patent application Ser. No. 13/480,969, filed on May 25, 2012 (now U.S. Pat. No. 9,041,421), which claims the benefit of provisional Application No. 61/496,451, filed on Jun. 13, 2011, the entirety of which are incorporated by reference herein.

BACKGROUND OF THE INVENTION

Field of the Invention

The present invention relates to semiconductor devices, and in particular to radio frequency (RF) testing systems for semiconductor devices.

Description of the Related Art

Semiconductor devices are manufactured in the form of wafers comprising many thousands of devices. The wafers are diced into dies and packaged into integrated circuits (IC). Each IC has been implemented by integrating more and more digital and analog circuits into a single chip.

Due to the increasing complexity of the testing of integrated RF circuits, to identify the "good" and "bad" ICs during production is a challenging problem for those conducting the wafer-level test or final test. In the traditional testing of RF circuits, what is used is expensive automatic test equipment (ATE), such as UltraFlex or Flex with RF instruments, or equipment used in mixing signals is used for generating an RF test signal (or RF patterns) to a device under test (DUT) and processing RF signals emanating from the DUT, leading to increased cost and time to conduct the tests.

Furthermore, more and more RF functions, such as 4G, LTE, 3G, 2G, Wifi, and Bluetooth, and processors (e.g. CPU, GPU, or DSP) have been integrated into a single chip (e.g. a system-on-chip) due to market demand and efforts in recent years to improve semiconductor technologies. It has become more and more time-consuming to test all the RF functions in the chip.

Therefore, there is a need for an effective RF test technique for transceivers that can solve the above-mentioned problems.

BRIEF SUMMARY OF THE INVENTION

A detailed description is given in the following embodiments with reference to the accompanying drawings.

In an exemplary embodiment, an integrated circuit (IC) is provided. The IC comprises: an RF transmitter configured to generate an RF signal when the IC has entered a test mode; an RF receiver configured to receive the RF signal in the test mode; and a computation unit having a plurality of processing units that are parallelized to perform a test procedure of the IC according to the received RF signal to determine one or more test results.

In some aspects of the embodiment, the processing units can be processing cores of a processor. In some other aspects of the invention. Alternatively, the processing units can be central processing units (CPU), graphics processing units (GPU), digital signal processors (DSP), or a combination thereof.

In another exemplary embodiment, an integrated circuit (IC) is provided. The IC comprises: a computation unit having a plurality of processing units; and a plurality of RF systems. Each RF system comprises: an RF transmitter configured to generate an RF signal when the IC has entered a test mode; and an RF receiver configured to receive the RF signal in the test mode. The processing units of the computation unit are parallelized to perform one or more test procedures of the RF systems to determine one or more test results of the RF systems.

In some aspects of the embodiment, the processing units can be processing cores of a processor. In some other aspects of the invention. Alternatively, the processing units can be central processing units (CPU), graphics processing units (GPU), digital signal processors (DSP), or a combination thereof.

In yet another exemplary embodiment, a radio frequency (RF) testing system is provided. The RF testing system comprises: an integrated circuit and module circuitry. The integrated circuit comprises: a computation unit having a plurality of processing units; and a plurality of RF systems, wherein each RF system comprises: an RF transmitter; and an RF receiver configured to receive the RF signal in the test mode. The module circuitry is configured to generate RF test signals to each RF system or detect the RF from the RF transmitter of each RF system. The processing units of the computation unit are parallelized to perform one or more test procedures of the RF systems to determine one or more test results of the RF systems.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
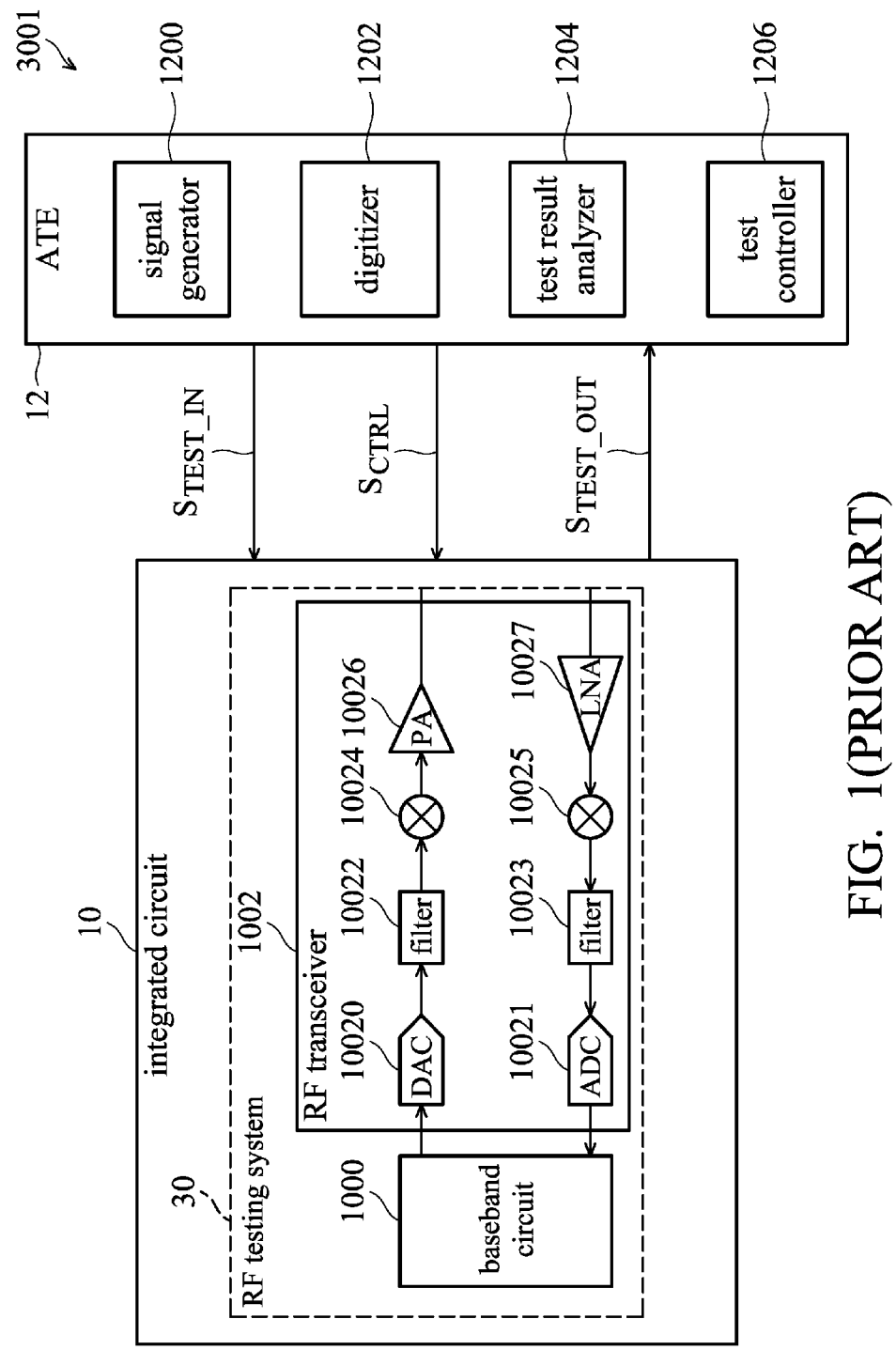
FIG. 1 is a block diagram of a conventional radio frequency (RF) testing system 1.

FIG. 1 is a block diagram of a conventional radio frequency (RF) testing system 3001. As illustrated in FIG. 1, the RF testing system 3001 comprises an integration circuit (IC) 10 and automatic test equipment (ATE) 12. The ATE 12 applies semiconductor testing for digital and analog elements in the IC 10 during the hardware manufacturing procedure. The IC 10 is a device under test (DUT) that receives power and testing patterns from the ATE 12 and outputs testing responses to the ATE 12. The ATE 12 is an electronic apparatus that receives a test program and performs tests accordingly on the DUT by supplying stimulus signals. The ATE 12 also receives outcome signals, takes signal measurements, evaluates test results based on the signal measurements, and determines whether the DUT is good or bad. The ATE 12 comprises a signal generator 1200, a digitizer 1202, a test result analyzer 1204 and a test controller 1206. The test controller 1206 sends a test control signal $S_{CTRL}$ to control all the registers in the IC 10 by some digital or analog pins to operate under a test mode. The signal generator 1200 may provide an analog signal or/and RF signal (test pattern $S_{TEST\_IN}$) to be injected into the IC 10 for the test of RF circuits. The digitizer 1202 digitizes an output response $S_{TEST\_OUT}$ from the IC 10 and converts analog signal or/and RF signal to digital signal. The test result analyzer 1204 analyzes the evaluated signal performance of the digitized signal to determine whether the DUT has any faulty components for the wafer-level test or final test.

The IC 10 in FIG. 1 includes an RF testing system 30, which comprises a baseband circuit 1000 and an RF transceiver 1002. The ATE 12 performs an RF test to the IC 10, particularly to all transceivers for various communication systems adopted by the IC 10 by feeding the analog or/and RF test pattern $S_{TEST\_IN}$ into the IC 10. The RF testing system 30 illustrates a transmitter path and receiver path, wherein the transmitter path comprising a digital-to-analog converter (DAC) 10020, a filter 10022, a modulator 10024, and a power amplifier (PA) 10026, and the receiver path comprising a low noise amplifier (LNA) 10027, a demodulator 10025, a filter 10023, and an analog-to-digital converter (ADC) 10021. For an RF test, the signal generator 1200 in the ATE 12 generates and injects a test pattern $S_{TEST\_IN}$ in high frequency to a testing interface (not shown) for testing the RF receiver in the RF testing system 30. The ATE 12 may further receive analog or/and RF signal $S_{TEST\_OUT}$ from the output of the transmitter path to evaluate the quality of transmitter of the IC 10.

In the conventional RF test, the ATE 12 supplies the analog or/and RF test pattern $S_{TEST\_IN}$ to the IC 10 and receives the analog or/and RF output response $S_{TEST\_OUT}$ from the IC 10, therefore there is high-speed communication between the ATE 12 and the IC 10, requiring the ATE 12 to work at a high speed, resulting in an increased cost of the ATE 12.

Figure 2:
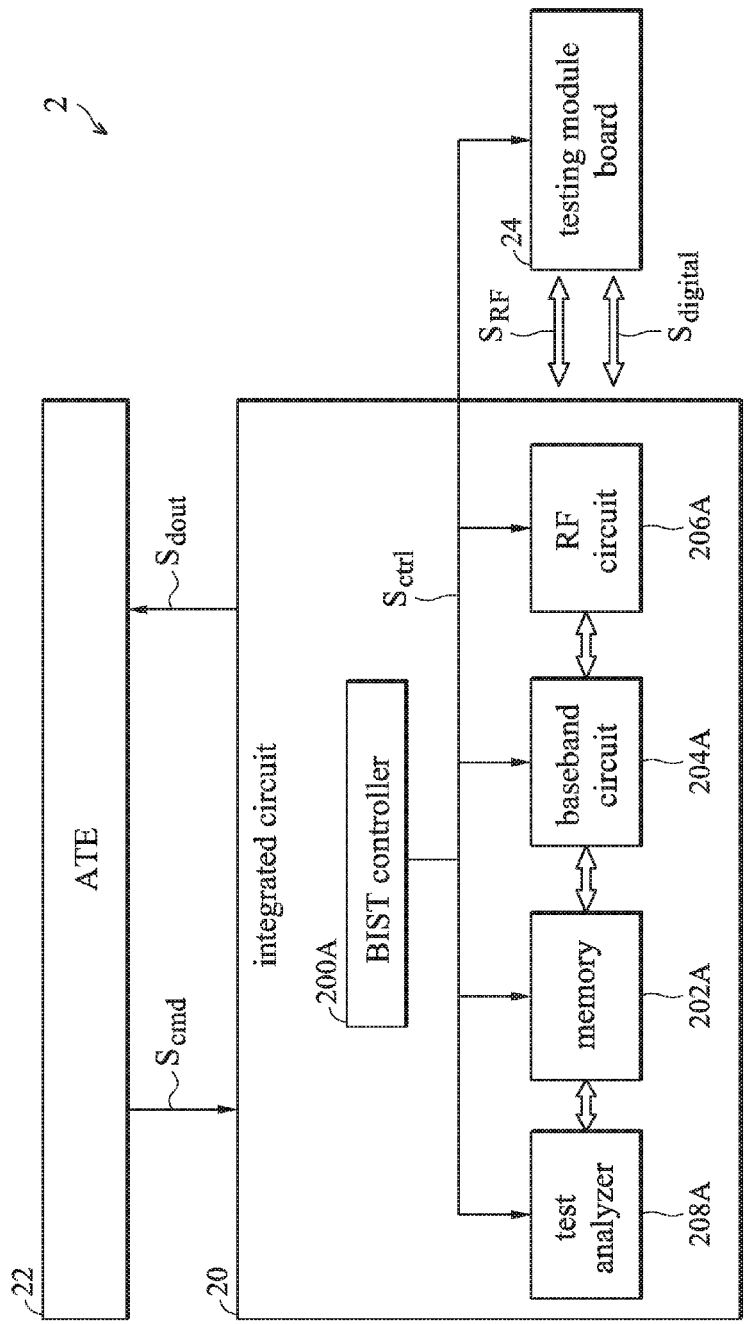
FIG. 2 is a block diagram of an RF built-in-self-test (BIST) system 2 according to an embodiment of the invention.

FIG. 2 is a block diagram of an RF BIST system 2 according to an embodiment of the invention, comprising an IC 20, an ATE 22, and a testing module board 24. The ATE 22 initializes an RF BIST by sending a command signal $S_{cmd}$ to the IC 20. In response, the IC 20 is arranged to enter into a test mode, and, in contrast to the ATE 22 controlling the test process in the conventional approach, the IC 20 takes controls of the test operations, which aims to locate defected building elements in a mixed mode circuitry or an analog circuitry in the IC 20. Under the test mode, the IC 20 communicates with the testing module board 24 using RF signals $S_{RF}$ and digital signals $S_{digital}$. The IC 20 may transmit RF signals S to the testing module board 24 for transmission performance evaluation or receive RF signals S from the testing module board 24, which is generated by the testing module board 24 itself or the IC 20 itself passing through the testing module board 24 using an external loopback path, to evaluate reception performance of the IC 20. The digital signals $S_{digital}$ may be an evaluation signal produced and sent by the testing module board 24 to the IC 20 for a test analysis. The testing module board 24 is external to the IC 20 and ATE 22, comprises discrete components thereon to assist signal property analysis as well as RF testing signal generation and receive a control signal $S_{ctrl}$ from the IC 20 in the test mode. In some implementations, an RF circuit 206A in the IC 20 may comprise RF transmitter to generate RF signal and RF receiver to receive RF signal from IC 20 itself by internal loopback path or testing module board 24. The quality of RF transmitter in RF circuit 206A may be evaluate by testing module board and/or IC 20 itself with a test analyzer 208A through internal or external loopback path. The RF receiver in RF circuit 206A also may be as a DUT to receive an RF signal from testing module board or IC 20 itself through internal or external loopback path and convert the RF signal to digital baseband signal. Consequently, the test analyzer 208A may be used to analyze captured digital signal saved in memory 202A and evaluate the quality of RF receive in RF circuit 206A.

The ATE 22 is capable of initiating various RF BISTs to the IC 20, including a single tone or one-tone test, a two-tone test, a multi-tone test, a noise figure (NF) test, a lock time test, a modulation test, etc. The ATE 22 may send the command signal or digital pattern $S_{cmd}$ informing the IC 20 of the type of the BIST that is to perform, so that the IC 20 can load corresponding test patterns internally according to the command signal $S_{cmd}$. The ATE 22 may transmit the digital pattern $S_{cmd}$ initiating one or more RF BIST types to IC 20.

The IC 20 in FIG. 2, comprises a BIST controller 200, a test analyzer 202A, a memory module 204A, a baseband circuit 206A, and an RF circuit 206A.

The BIST controller 200A is internally coupled to the memory module 202, the baseband circuit 204A, the RF circuit 206A, and a test analyzer 208A, and externally coupled to the testing module board 24 to take control of the test operations through the control signal $S_{ctrl}$. The control signal $S_{ctrl}$ is a baseband signal having a frequency close to zero, and may be in digital or analog form. The BIST controller 200A controls the testing module board 24 to operate under the test mode through the control signal $S_{ctrl}$.

The memory module 202A and the baseband circuit 204A may be implemented as a signal generator, which is programmed to sequentially perform various tests by producing and injecting the test patterns into the RF circuit 206A for the tests including the one-tone test, the two-tone test, the multi-tone test, the NF test, the lock time test, the modulation test, etc. In some implementations, the memory module 202A is also served as a temporary data storage for captured baseband signals from the baseband circuit 204A or RF BIST results from the test analyzer 208A. The test analyzer 208A can be used to measure power at frequency associated with wanted tone, image tone or second-order or third-order harmonics to test transmitter/receiver gain, image rejection ratio (IRR), input second intercept point (IIP2), input third intercept point (IIP3), etc. In test analyzer 208A, we can implement a noise power estimator to calculate noise power or signal-to-noise ratio (SNR) of receiver for NF test. The lock time measure can also be implemented by software or hardware in the test analyzer 208A to test the lock time of a phase-locked loop (PLL) which comprises the instantaneous frequency estimation, lock time calculation using the information of the frequency estimates, and pass/fail decision. Some estimators of modulated tests such as error vector magnitude (EVM) and spectrum estimators can also be implemented in the test analyzer 208A to evaluate the quality of RF transmitter in RF circuit 206A.

The transmitter path is usually tested at the system level test by the EVM and spectrum, nonlinearity tests such as IIP2 and IIP3, an image signal test, a carrier leakage test, and a transmission power test. The evaluated characteristics for the receiver path comprise a receiver gain test, an image signal test, a DC offset test, NF test, and nonlinearity test such as IIP2 and IIP3.

The RF circuit 206A comprises building circuit elements for an RF transmitter and an RF receiver, including a DAC, an ADC, a filter, a modulator, a demodulator, a local oscillator, a PA, and an LNA. The BIST may be applied to test a single element or a circuit in the RF circuit 206A or whole transmission or reception path. The test analyzer 208A receives the evaluation signals from either the testing module board 24 or the RF circuit 206A to determine a test result signal $S_{dout}$ indicative of whether the DUT has passed or failed the test, and then reports the test result signal $S_{dout}$ to the ATE 22. The command signal $S_{cmd}$ and the test result signal $S_{dout}$ are baseband signals that are at a frequency substantially close to zero, and may be in digital or analog form.

In some implementations, the IC 20 can further comprise a compensator (not shown) to compensate or adjust parameters for the RF circuit elements 206A using digital or analog circuit based on evaluated characteristics of the captured digital signal in test analyzer. In comparison to the conventional RF approach, the present embodiment depicts an RF BIST system where the ATE 22 is only used to initiate the test and keep the test results. The RF BIST tasks including test pattern generation, signal analysis, and test result justification are now shifted to either the IC 20 or the testing module board 24. Consequently, circuit complexity of the ATE 22 can be reduced, thereby decreasing design and manufacturing cost of the ATE 22. Further, the testing module board 24 is included in the test to assist evaluation of the signal characteristics for the signature response, or loop back the transmitter response to the RF receiver. Thus, there are a high-speed communication $S_{RF}$ between the IC 20 and testing module board 24.

Figure 3:
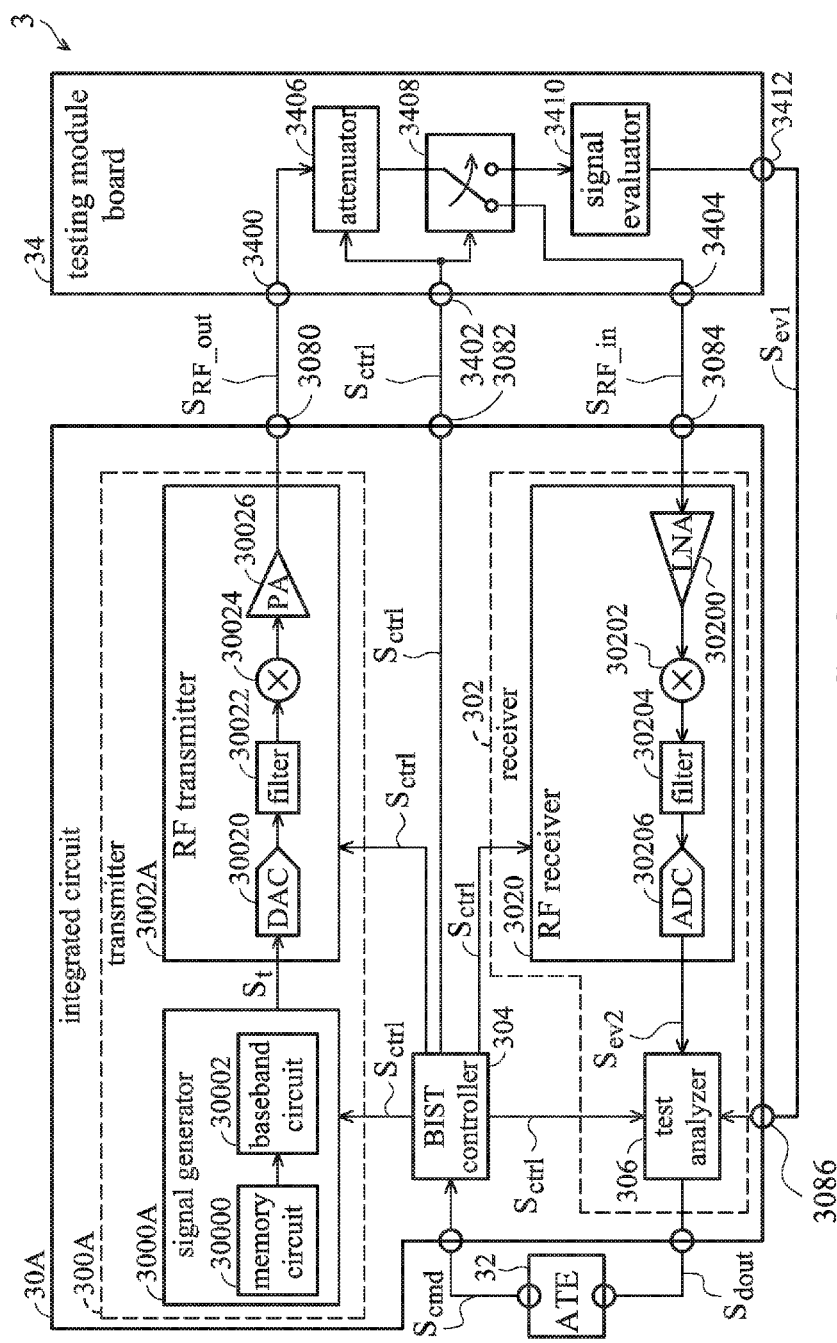
FIG. 3 is a block diagram of an RF BIST system 3 according to another embodiment of the invention.

FIG. 3 shows a block diagram of an RF BIST system 3 according to an embodiment of the invention, comprising an IC 30, an ATE 32, and a testing module board 34. The ATE 32 carries out an RF BIST by initiating a baseband command signal $S_{cmd}$ to the IC 30A. In response, the IC 30A enters a test mode and generates a test pattern signal $S_t$ internally. The test pattern $S_t$ is sent to a RF transmitter 3002A to undergo various analog circuit passing in the transmitter path, rendering an outgoing RF signal $S_{RF\_out}$, which is further sent to the testing module board 34 to perform signal analysis. The testing module board 34 exhibits two configurations in the embodiment, one configuration performs signal analysis on the outgoing RF signal $S_{RF\_out}$ to produce a first evaluation signal $S_{ev1}$, and the other configuration loops the outgoing RF signal $S_{RF\_out}$ back to a receiver 302 in the IC 30A. Since the outgoing signal $S_{RF\_out}$ is RF signal passing analog circuits in the transmitter path, it bears information on the circuit elements. In the signal analysis configuration, the testing module board 34 can evaluate electrical characteristics of the target circuit element based on the outgoing RF signal $S_{RF\_out}$ to output a first baseband evaluation signal $S_{ev1}$, which is further reported back to the IC 30A. Based on the first evaluation signal $S_{ev1}$, the IC 30A then determines and reports a test result signal $S_{dout}$ back to the ATE 32, informing the ATE 32 whether the DUT has passed or failed the test. In the loopback configuration, the outgoing RF signal $S_{RF\_out}$ is transferred to the receiver 302 to undergo RF impairments in a receiver path, outputting a second baseband evaluation signal $S_{ev2}$ to the test result analyzer 306. The second baseband evaluation signal $S_{ev2}$ can be used by the test result analyzer 306 to determine electrical characteristics and functional validity of a receiver circuit element on the receiver path. The command signal $S_{cmd}$ and the test result signal $S_{dout}$ are baseband signals that are at a frequency substantially close to zero, and may be in digital or analog form.

The IC 30A comprises a transmitter 300A, a receiver 302, and a BIST controller 304. The transmitter 300A and the receiver 302 may belong to the same or different transceiver systems. For examples, the transmitter 300A and the receiver 302 may both belong to a WLAN system, or may belong to a WLAN system and a Bluetooth system respectively. The transmitter 300A further comprises a signal generator 3000A and a RF transmitter 3002A. In some implementations, the signal generator 3000A comprises a memory 30000 that keeps various test patterns for BISTs therein and a baseband circuit 30002 that performs digital power control (not shown) and/or digital compensations (not shown) such as in-phase/quadrature (IQ) mismatch and digital pre-distortion. The RF transmitter 3002A comprises a DAC 30020, a filter 30022, a modulator 30024, and a PA 30026. Similarly, the RF receiver 3020 comprises an LNA 30200, a demodulator 30202, a filter 30204, and an ADC 30206. The modulator 30024 and demodulator 30202 may further receive carrier signals from one or more local oscillators (not shown) to modulate and demodulate the outgoing and incoming RF signals respectively. Upon receiving the command signal $S_{cmd}$, the BIST controller 304 enables relevant circuit elements in IC 30 including the signal generator 3000A, the RF transmitter 3002A, the test result analyzer 306, and the RF receiver 302 to enter into the test mode and control the external circuit components in testing module board 34 including adjustable attenuator and switch. In some implementations, a digital filter is present between the ADC 30206 and the test result analyzer 306. In some implementations, the BIST controller 304 also controls the testing module board 32 to operate under the test mode. The test signal generator 3000A is arranged to generate the test signal $S_t$ in response to the command signal $S_{cmd}$. After test signal $S_t$ is fed into the RF transmitter 3002A, the RF transmitter 3002A is arranged to generate the response signal $S_{RF\_out}$. The test result analyzer 306 may be implemented by a digital signal processing (DSP) unit or hardware circuits, and arranged to determine and report the test result signal $S_{dout}$ to the ATE 32. The test result signal $S_{dout}$ is determined based on the first evaluation signal $S_{ev1}$ and processed results of the second evaluation signal $S_{ev2}$. Specifically, in some implementations, the test result signal $S_{dout}$ is determined based on a first evaluation signal $S_{ev1}$ derived from the RF signal $S_{RF\_out}$. In other implementations, the test result signal $S_{dout}$ is determined based on the second evaluation signal $S_{ev2}$ which is derived by feeding back the response signal $S_{RF\_out}$ to the RF receiver 3020.

The IC 30A comprises a first communication port 3080, a second communication port 3082, a third communication port 3084, and a fourth communication port 3412 for communication with the testing module board 34. The first communication port 3080 outputs the outgoing RF signal $S_{RF\_out}$ to the testing module board 34 and the third communication port 3084 acquires the incoming RF signal $S_{RF\_in}$ from the testing module board 34. In addition, the two ports 3080 and 3084 need enough isolation for self-test. Consequently the two ports 3080 and 3084 cannot be implemented by a common communication port on the IC 30. The IC 30A directs the control signal $S_{ctrl}$ through the second communication port 3082 to control the testing module board 34. The fourth communication port 3086 receives the results of signal evaluator 3410 from the testing module board 34.

The testing module board 34 is external to the IC 30A and ATE 32, and comprises an input port 3400, a control port 3402, a loopback port 3404, an adjustable attenuator 3406, a switch 3408, and a signal evaluator 3410 which can be implemented by a power detector, and an output port 3412. In some implementations, a testing load board (not shown) is provided to hold the testing module board 34 and the IC 30A together. The testing load board may comprise an IC socket (not shown) to accept the IC 30A and a module slot (not shown) to hold the testing module board 34 in place during the test. The input port 3400 accepts the response RF signal $S_{RF\_out}$ from the IC 30A. The control port 3402 receives the control signal $S_{ctrl}$ from the IC 30A to enable the testing module board 34 work under the test mode. The control signal $S_{ctrl}$ controls the attenuator 3406 and the switch 3408. The attenuator 3406 receives controls by the control signal $S_{ctrl}$ to adjust attenuation level to the RF signal $S_{RF\_out}$. The switch 3408 is selected by the control signal $S_{ctrl}$ to switch between the signal analysis configuration and the loopback configuration. In the signal analysis configuration, the transmitter response signal $S_{RF\_out}$ is transferred to the signal evaluator 3410 to determine a power level or a baseband signal thereof as the first evaluation signal $S_{ev1}$, which is reported back to the IC 30 through the output port 3412. In the loopback configuration, the transmitter output signal $S_{RF\_out}$ is looped back through the attenuator 3406 as an input RF signal $S_{RF\_in}$ to the RF receiver 3020 for a further test in the receiver path. In the receiver, the input RF signal $S_{RF\_in}$ is down-converted into the baseband, which is digitized into digital words that are processed by a baseband circuit or DSP.

Although the testing module board 34 accepts the control signal $S_{ctrl}$ from the IC 30A, it should be appreciated by the people skilled in the art that the testing module board 34 can also receive controls from the ATE 32 or provide the control signal by the testing module board 34 locally without deviating from the principle of the invention.

In comparison to the conventional RF test mechanism, the present embodiment depicts an RF BIST system where the ATE 32 is only used to initiate the test and keep the test results. The other RF BIST tasks include test pattern generation, signal analysis, and test result justification, is controlled by the IC 30A and shifted to either the IC 30A or the testing module board 34, leading to a reduction in circuit complexity of the ATE 22, thereby decreasing design and manufacturing cost. Only low-frequency command signal $S_{cmd}$ and test result signal $S_{dout}$ are exchanged between the IC 30A and the ATE 32.

Figure 4:
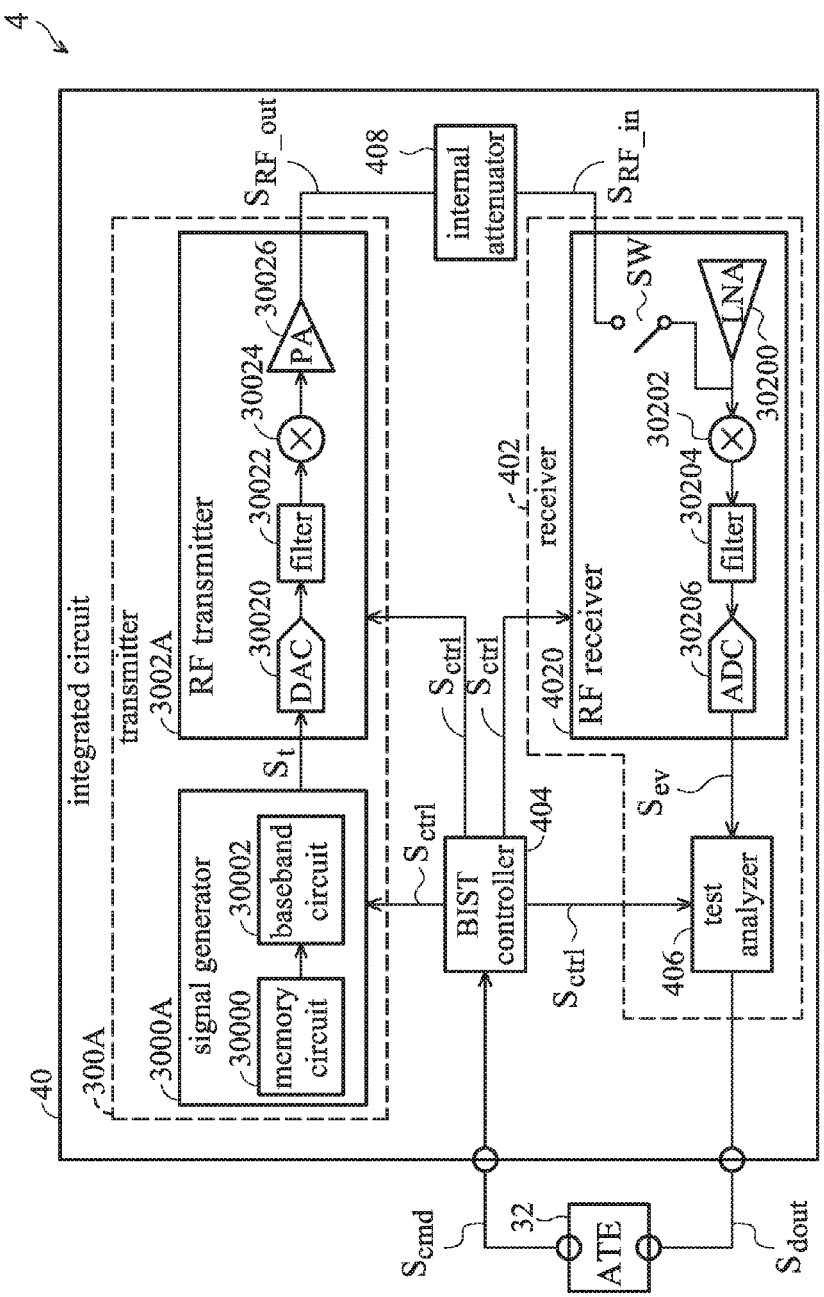
FIG. 4 is a block diagram of an RF BIST system 4 according to another embodiment of the invention.

FIG. 4 is a block diagram of an RF BIST system 4 according to another embodiment of the invention, comprising an integrated circuit 40 and the ATE 32. The circuit configuration in FIG. 4 is identical to that in FIG. 3 except that the outgoing RF signal $S_{RF\_out}$ is looped back through an internal attenuator 408 between the output of the RF transmitter 3002A and the input of RF receiver 4020, such that the signal performance of the RF transmitter 3002A and RF receiver 4020 can be evaluated without uses of the external testing module board 34 in FIG. 3. Upon being triggered by the command signal $S_{cmd}$, the IC 40 is able to run the RF BIST procedure all by itself to evaluate performance of a selected circuit element or a selected circuit path, and report the RF BIST result back to the ATE 32, without aids from any external circuitry.

The RF BIST is performed at a system level, where the transmitter 300A and receiver 402 belong to a same system. The ATE 32 issues the command signal $S_{cmd}$ to the IC 40 to start the test. In response to the command signal $S_{cmd}$, the BIST controller 404 is initialed to enable the test mode and control the RF BIST processes. The signal generator 3000A produces the corresponding test pattern $S_t$, which is processed through the RF transmitter 3002A and the input of RF receiver 4020 to render the evaluation signal $S_{ev}$. The different test patterns $S_t$ can easily be generated by the implementation of signal generator 3000A in the IC 40 to accommodate different test items. Hence, utilizing the test analyzer 406 the quality of the RF transceiver in IC 40 can be evaluated by processing the signal $S_{ev}$ to determine the test result, good or bad, of IC 40 and report the result to the ATE 32. The IC 40 provides the loopback attenuator 408 to loop back the RF signal $S_{RF\_out}$ from the RF transmitter 3002A to RF receiver 4020, thereby eliminating the uses of the testing module board 34 while still able to carry out the most RF BIST processes in the IC 40. Similar to the RF BIST system 3, the RF BIST system 4 utilizes low-frequency communication between the ATE 32 and IC 40, offering a cost reduction in the ATE 32.

Figure 5:
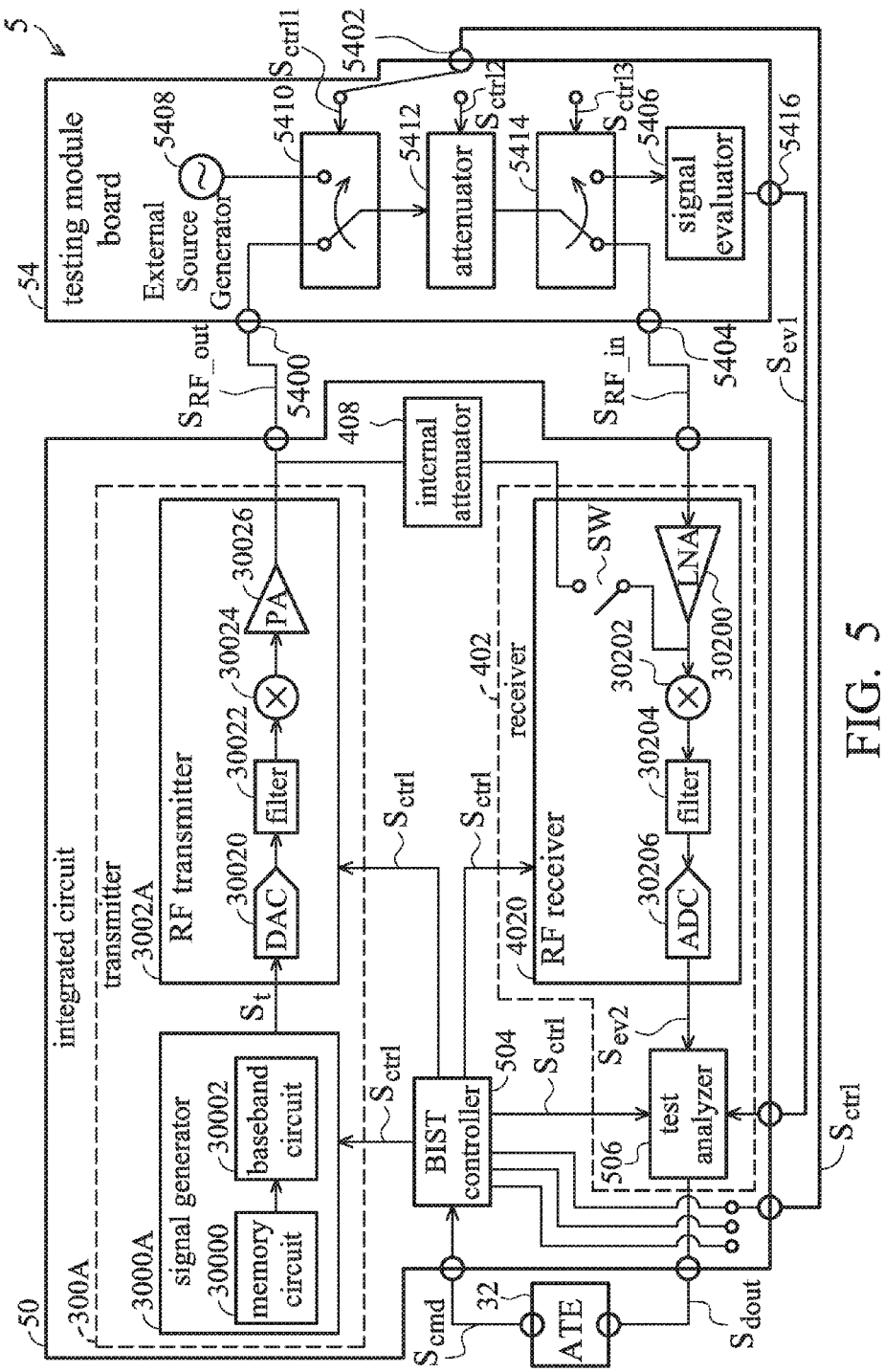
FIG. 5 is a block diagram of an RF BIST system 5 according to yet another embodiment of the invention.

FIG. 5 is a block diagram of an RF BIST system 5 according to yet another embodiment of the invention, comprising an IC 50, an ATE 32, and a testing module board 54. The circuit configuration in FIG. 5 is identical to that in FIG. 4 except that the testing module board 54 is connected to the IC 50. The testing module board 54 is external to the IC 50 and the ATE 32 and comprises circuit elements customized to assist signal analysis of the outgoing RF signal $S_{RF\_out}$, thereby determining the first evaluation signal $S_{ev1}$ indicative of an electrical characteristic of the $S_{RF\_out}$. The testing module board 54 receives control externally from either the IC 50 or the ATE 32. The embodiment in FIG. 5 depicts the case where the testing module board 54 receives a control signal $S_{ctrl}$ from the IC 50 to select performing signal analysis on the transmitter path, or looping the RF signal $S_{RF\_out}$ back to the receiver path, or performing other testing initiated by or measured by the testing module board 54.

The testing module board 54 comprises an input port 5400, a control port 5402, a loopback port 5404, a signal evaluator 5406, an external source generator 5408, a first switch 5410, an attenuator 5412, a second switch 5414, and an output port 5416. The input port 5400 is configured to receive the output RF signal $S_{RF\_out}$ that carries information of the DUT on the transmitter path. In some embodiments, the input port 5400 and loopback port 5404 of the testing module board 54 are implemented by separated ports while the RF transmitter 3002A and RF receiver 4020 on the IC 50 respectively transmit and receive RF signals by separate ports. In other embodiments, the input port 5400 and the loopback port 5404 can be realized by a common port while the RF transmitter 3002A and RF receiver 4020 on the IC 50 respectively transmit and receive RF signals by another common port. The signal evaluator 5406 is configured to be controlled by an external controller, either by the IC 50 or the ATE 32, to evaluate the outgoing RF signal $S_{RF\_out}$ to determine a first evaluation signal $S_{ev1}$ indicating an electrical characteristic of the first test result signal. In turn, the first evaluation signal $S_{ev1}$ is output to the IC 50 for a test result analysis through the output port 5416. In some implementations, the signal evaluator 5406 is a power detector monitoring power in the outgoing RF signal $S_{RF\_out}$. In other implementations, the signal evaluator 5406 is a component which includes one or more analog/digital circuit to convert the RF signal to baseband digital signal and sends the digital signal to IC 50 by output port 5416. The external source generator 5408 is configured to generate an RF test pattern that may be injected into the receiver path as a clear source or reference source in order to evaluate the RF receiver 4020. The first switch 5410 is configured to select one of the output signal $S_{RF\_out}$ generated by the IC 50 and the second test pattern generated by external source generator 5408 in the testing module board 54. The attenuator 5412 is configured to generate RF source with different signal levels. The second switch 5414 is configured to select one of performing signal analysis on the transmitter path and providing a test pattern to the receiver path. The testing module board 54 receives the control signal $S_{ctrl}$ from the BIST controller 504 to determine a function implemented thereon. In order words, the BIST controller 504 can respectively control at least one of the first switch 5410, the attenuator 5412 and the second switch 5414 by the control signal $S_{ctrl}$ via the control port 5402.

Although the IC 50 incorporates a transmitter path circuitry and a receiver path circuitry, the person in the art will recognize that the RF BIST therefore may be carried out separately according to the principle of the invention. In some implementations, the IC 50 performs a test only on the transmitter path circuitry, so that the testing module board 54 can evaluate the electrical characteristics of the signature response $S_{RF\_out}$ of the transmitter path to output the evaluation signal $\overline{S}_{ev1}$ to the test result analyzer 506. In other implementations, the IC 50 performs a test only on the receiver path circuitry, the testing module board 54 assists to provide the test pattern from source generator 5408 to be injected into the RF receiver 4020 to output the evaluation signal $S_{ev2}$ to the test result analyzer 506 for receiver tests such as receiver gain, IQ mismatch, DC offset, and nonlinearity, etc.

The RF BIST system 5 provides the customized testing module board 54, capable of evaluating the signal properties for the response signal $S_{RF\_out}$ of the RF transmitter 3002A and generating a RF test pattern to be injected into the RF receiver 4020, thereby assisting the test signal generation and signal evaluation in the RF BIST processes. Similar to the RF BIST system 3, the RF BIST system 5 utilizes low-frequency communication between the ATE 32 and IC 50, resulting in a cost reduction in the ATE 32.

Figure 6:
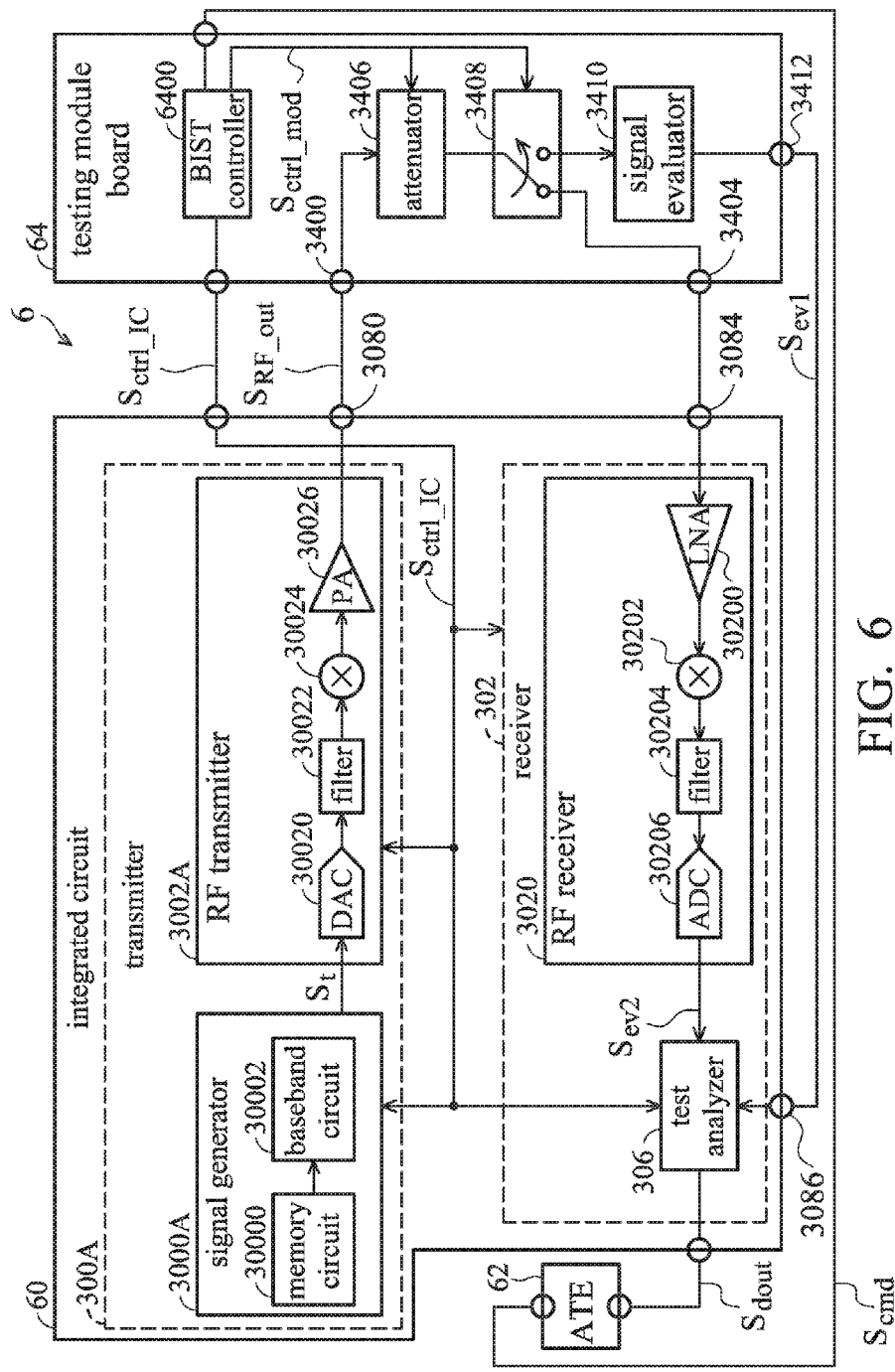
FIG. 6 is a block diagram of an RF BIST system 6 according to still yet another embodiment of the invention.

FIG. 6 is a block diagram of an RF BIST system 6 according to still yet another embodiment of the invention, comprising an integrated circuit 60, an ATE 62, and a testing module board 64. The ATE 62 identical to the ATE 22 and ATE 32 in FIG. 2 and FIG. 3, reference therefor is detailed in the preceding paragraphs. The circuit configuration and connection is identical to that in the RF BIST system 3, except that in the RF BIST system 6, a BIST controller 6400 is placed at the testing module board 64, so that the RF test control can be adapted and managed externally from the IC 60. In the embodiment, the testing module board 64 comprises the BIST controller 6400 which receives a command signal $S_{cmd}$ from the ATE 62 for initiating an RF BIST. Instead of controlling the RF BIST procedure from the IC, the BIST controller 6400 oversees all RF BIST operations occurring in the IC 60 by an IC control signal $S_{ctrl\_IC}$, and controls RF BIST operations in the testing module board by a module control signal $S_{ctrl\_mod}$. Upon receiving the command signal $S_{cmd}$, through the IC control signal $S_{ctrl\_IC}$, the BIST controller 6400 controls the signal generator 3000A to produce a test pattern $S_t$ for a corresponding RF BIST for the transmitter path or the loopback path and enables the test pattern $S_t$ to pass through the RF transmitter 3002A and output an RF output signal $S_{RF\_out}$ to the testing module board 64. The BIST controller 6400 also controls the circuit blocks in the testing module board to perform relevant RF BIST operations. In the embodiment, using the module control signal $S_{ctrl\_mod}$, the BIST controller 6400 enables the attenuator 3406 to change power level of the received RF output signal $S_{RF\_out}$, or controls the switch 3408 to switch between the signal evaluator 3410 for performing power detection test and/or the loopback path to the IC 60 for performing the BIST for the receiver path of the receiver 302. The BIST controller 6400 may further control the test analyzer 306 in the IC 60 via the IC control signal $S_{ctrl\_IC}$ to perform test analysis on RF BIST using the first evaluation signal $S_{ev1}$ from the testing module board 64, or using the second evaluation signal $S_{ev2}$ from the receiver 302. Followed by the test analysis, the test analyzer 306 may direct the test result $S_{dout}$ back to the ATE 62 and proceed for the next test.

Figure 7:
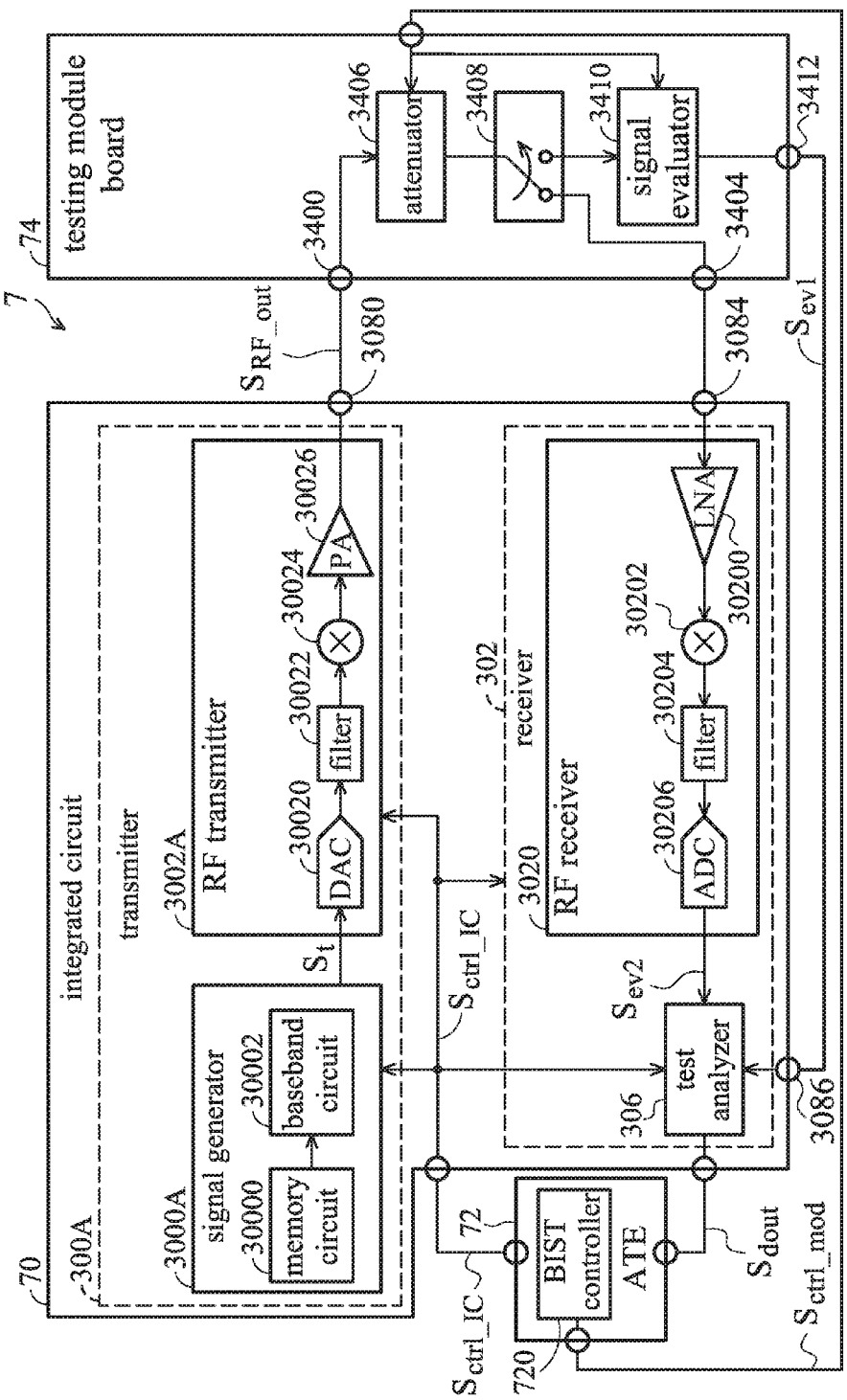
FIG. 7 is a block diagram of an RF BIST system 7 according to yet another embodiment of the invention.

FIG. 7 is a block diagram of an RF BIST system 7 according to yet another embodiment of the invention, comprising an integrated circuit 70, an ATE 72, and a testing module board 74. The testing module board 74 identical to the testing module board 34 FIG. 3, reference therefor is detailed in the preceding paragraphs. The circuit configuration and connection is identical to that in the RF BIST system 3, except that in the RF BIST system 7, a BIST controller 720 is provided at the ATE 72. In the embodiment, the IC 70 and the testing module board 74 receive test controls from the ATE 72, thus no command signal $S_{cmd}$ is required to initiate an RF BIST. The BIST controller 720 manages all RF BIST operations in the IC 70 by an IC control signal $S_{ctrl\_IC}$, and controls all RF BIST operations in the testing module board 74 by a module control signal $S_{ctrl\_mod}$. Through the IC control signal $S_{ctrl\_IC}$, the BIST controller 720 controls the signal generator 3000A to produce a test pattern $S_t$ for a corresponding RF BIST for the transmitter path or the loopback path and enables the test pattern $S_t$ to pass through the RF transmitter 3002A and output an RF output signal $S_{RF\_out}$ to the testing module board 74. Through the module control signal $S_{ctrl\_mod}$, the BIST controller 720 controls the attenuator 3406 to change power level of the received RF output signal $S_{RF\_out}$, or controls the switch 3408 to switch between the signal evaluator 3410 for performing power detection test and/or the loopback path to the IC 70 for performing the BIST for the receiver path of the receiver 302. The BIST controller 720 may further control the test analyzer 306 in the IC 70 via the IC control signal $S_{ctrl\_IC}$ to perform test analysis on RF BIST using the first evaluation signal $S_{ev1}$ from the testing module board 74, or the second evaluation signal $S_{ev2}$ from the receiver 302. Followed by the test analysis, the test analyzer 306 may report the test result $S_{dout}$ back to the ATE 62 and proceed for the next test.

Figure 8:
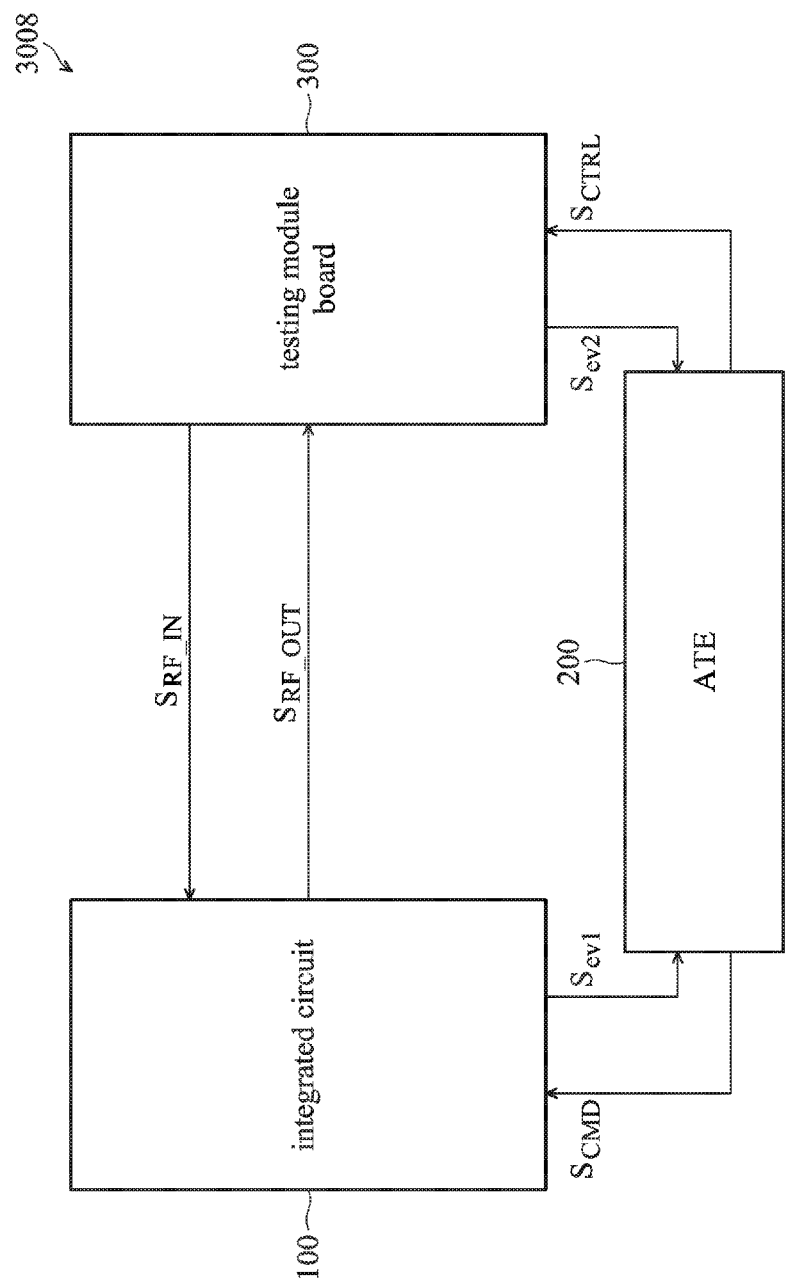
FIG. 8 is a simplified schematic block diagram of an RF testing system 3008 according to an embodiment of the invention.

FIG. 8 is a simplified schematic block diagram of an RF testing system 3008 according to an embodiment of the invention. As illustrated in FIG. 8, the RF testing system 3008 may comprise an IC 100, ATE 200, and a testing module board (e.g. a module circuitry) 300. The ATE 200 initializes a test process by sending a command signal $S_{CMD}$ to the IC 100. In response, the IC 100 is arranged to enter into a test mode, and, in contrast to the ATE 200 controlling the test process in the conventional approach, the IC 100 takes control of the test operations. However, this is for illustrative purpose rather than a limitation of the present invention. In other embodiments (which will be illustrated later), the test process control may take place in the testing module board 300, where the ATE 200 send the command signal $S_{CMD}$ to the testing module board 300, and the testing module board 300 then sends a control signal to the IC 100 accordingly. Or, the ATE 200 may be equipped with the test process controlling. Moreover, the test process aims to locate defective build elements in mixed-mode circuitry or analog circuitry in the IC 100. Under the test mode, the IC 100 communicates with the testing module board 300 using RF signals or analog signals. For example, the IC 100 may transmit the RF signals $S_{RF\_OUT}$ to the testing module board 300 for transmission-performance evaluation or receive RF signals $S_{RF\_IN}$ from the testing module board 300, which is generated by the testing module board 300 itself or the IC 100 itself and passing through the testing module board 300 using an external loopback path, to evaluate the reception performance of the IC 100 (details will be described later). The output signals $S_{ev1}$ may be an evaluation signal which is low-frequency (e.g., baseband, close to zero) produced and sent by the IC 100 to the ATE 200 for a test analysis. Similarly, the output signals $S_{ev2}$ may be an evaluation signal which is low-frequency (e.g., baseband, close to zero) produced and sent by the testing module board 300 to the ATE 200 for a test analysis. The testing module board 300, which is external to the IC 100 and ATE 200, comprises discrete components to assist signal property analysis as well as RF testing signal generation and receive a control signal $S_{CTRL}$ from the ATE 200 in the test mode. In this way, the ATE 200 does not need to process high-frequency (e.g. radio frequency) signals, and therefore the cost can be reduced. As the test analysis is performed by the ATE 200, the DUT is not necessarily equipped with a digital signal processor, that is, the IC 100 can be a system-on-chip (SOC) circuit or a stand-alone RF IC. In the following sections, different test configurations will be described.

Figure 9:
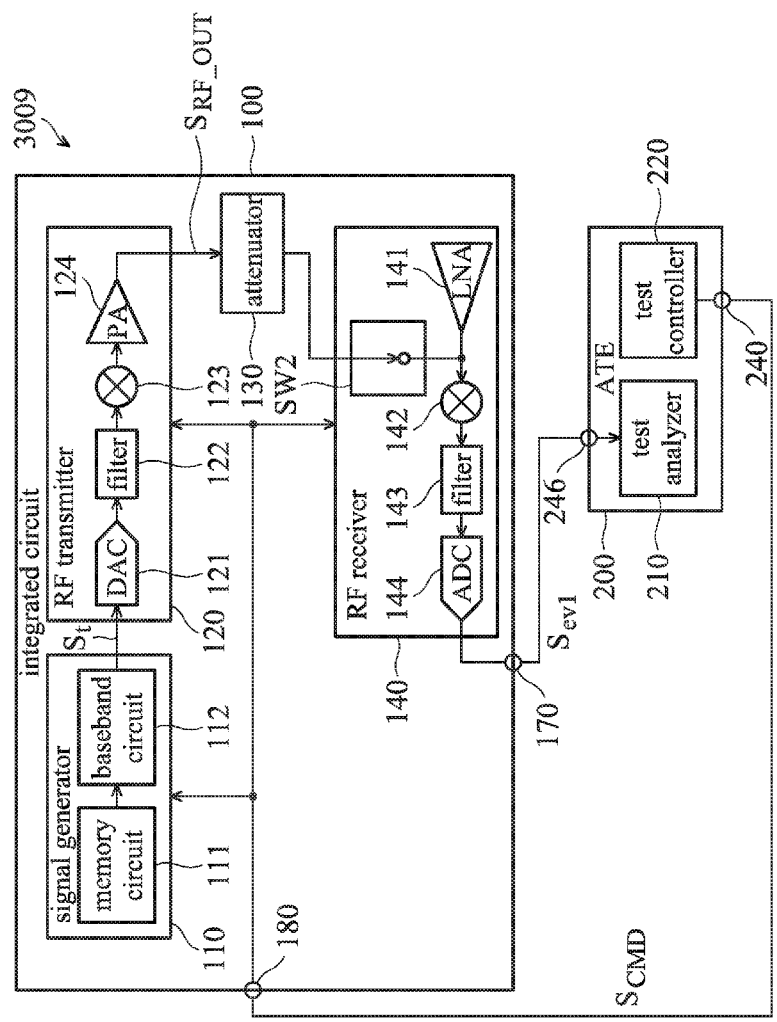
FIG. 9 is a detailed schematic block diagram of an RF testing system 3009 according to an embodiment of the invention.

FIG. 9 is a detailed schematic block diagram of the RF testing system 3009 according to an embodiment of the invention. The RF testing system 3009 may comprise an IC 100 and ATE 200. For example, the IC 100 may be a system-on-chip (SOC) or a stand-alone RF IC having digital-to-analog converters (DAC) and analog-to-digital converters (ADC). As illustrated in FIG. 9, the IC 100 comprises a signal generator 110, an RF transmitter 120, an attenuator 130, an RF receiver 140, and communication ports 170, 180. The RF transmitter 120 and the RF receiver 140 may belong to the same or different transceiver systems. For examples, the transmitter 120 and the receiver 140 may both belong to a WLAN system, or they may respectively belong to a WLAN system and a Bluetooth system. In some implementations, the signal generator 110 comprises a memory circuit 111 that keeps various test patterns for the RF test process therein, and a baseband circuit 112 that performs digital power control (not shown) and/or digital compensations (not shown) such as in-phase/quadrature (IQ) mismatch and digital pre-distortion. The RF transmitter 120 comprises a DAC 121, a filter circuit 122, a modulator 123, and a power amplifier (PA) 124. Similarly, the RF receiver 140 comprises a demodulator 142, a filter 143, and an ADC 144. The modulator 123 and demodulator 142 may further receive carrier signals from one or more local oscillators (not shown) to modulate and demodulate the outgoing and incoming RF signals, respectively. In this internal loopback configuration, the communication port 170 outputs an evaluation signal $S_{ev1}$ generated by the RF receiver 140 to the ATE 200.

As illustrated in FIG. 9, the ATE 200 may comprise a test analyzer 210, a test controller 220, and communication ports 240, 246. The test controller 220 of the ATE 200 directs the command signal $S_{CMD}$ through the communication ports 240 and 180 to components of the IC 100, thereby controlling components of the IC 100 to perform the RF test process. In response, the IC 100 enters a test mode and generates a test pattern signal $S_t$ internally. The test pattern $S_t$ is sent to the RF transmitter 120 to undergo various analog circuits passing in the transmitter path, rendering an outgoing RF signal $S_{RF\_OUT}$, which is further sent to the RF receiver 140 through the internal attenuator 130. The test analyzer 210 can be used to measure power at frequency associated with wanted tone, image tone or second-order or third-order harmonics to test transmitter/receiver gain, image rejection ratio (IRR), input second intercept point (IIP2), input third intercept point (IIP3), etc. In the test analyzer 210, we can implement a noise-power estimator to calculate noise power or signal-to-noise ratio (SNR) of the receiver for the NF test. The lock-time measure can also be implemented by software or hardware in the test analyzer 210 to test the lock time of a phase-locked loop (PLL), which comprises the instantaneous frequency estimation, lock-time calculation using the information of the frequency estimates, and pass/fail decision. Some estimators of modulated tests such as error vector magnitude (EVM) and spectrum estimators can also be implemented in the test analyzer 210 to evaluate the quality of the RF transmitter 120.

Specifically, in the internal loopback configuration, the outgoing RF signal $S_{RF\_OUT}$ is transferred to the demodulator 142 of the RF receiver 140 through the attenuator 130 to undergo RF impairments in a receiver path, outputting a first baseband evaluation signal $S_{ev1}$ through the communication port 170 to the test analyzer 210 of the ATE 200 for test analysis.

Figure 10:
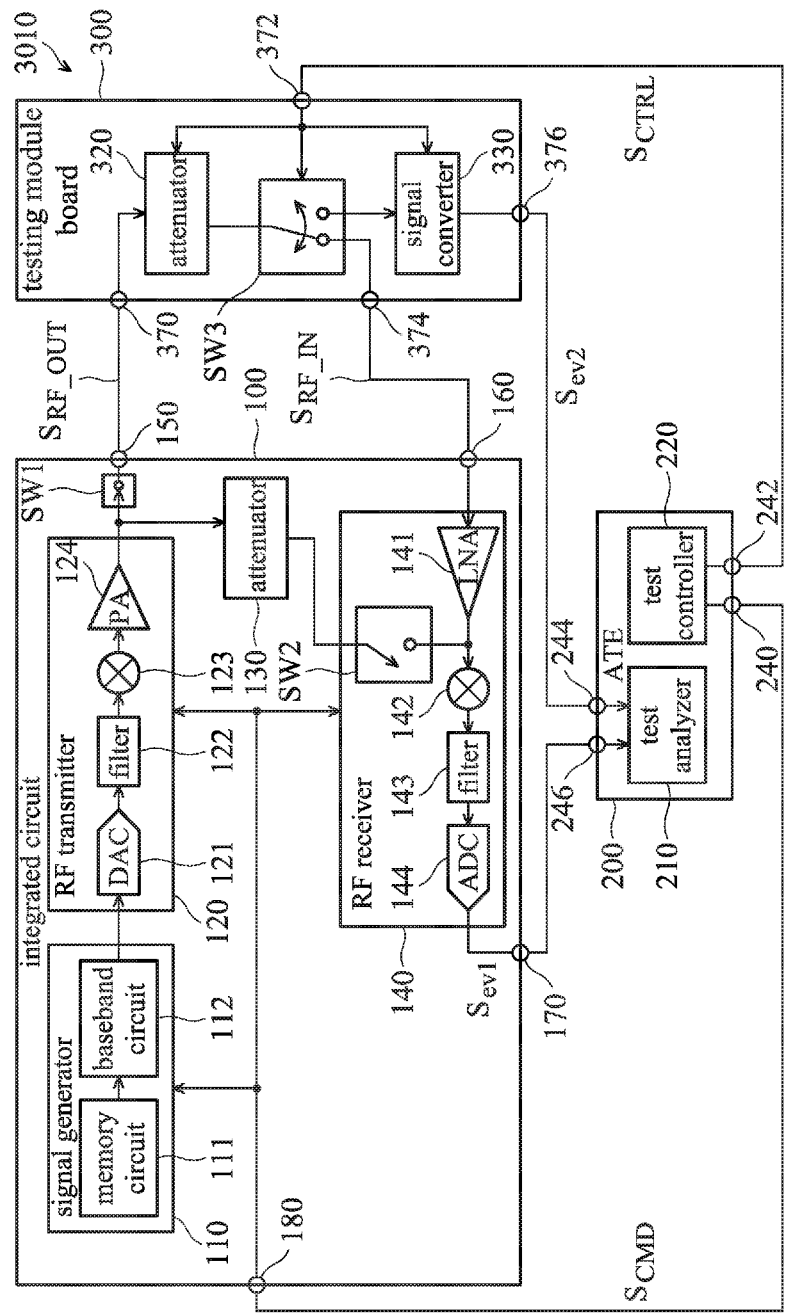
FIG. 10 is a detailed schematic block diagram of the RF testing system 3010 according to another embodiment of the invention.

FIG. 10 is a detailed schematic block diagram of the RF testing system 3010 according to another embodiment of the invention. The circuit configuration is similar to that in FIG. 9 except that the testing module board 300 is connected to the IC 100 and a low noise amplifier (LNA) 141 and switches SW1, SW2 are involved. The input of the demodulator 142 can be from the internal attenuator 130 or from the LNA 141 when the internal loopback path or the external loopback path is selected, respectively (details will be described later). When the internal loop-back path is selected (corresponding to FIG. 3), the switch SW1 is opened and the switch SW2 is closed, so that the outgoing RF signal $S_{RF\_OUT}$ is looped back through the internal attenuator 130 between the output of the RF transmitter 120 and the input of the RF receiver 140, such that the signal performance of the RF transmitter 120 and RF receiver 140 can be evaluated without the use of the external testing module board 300. In the embodiment of FIG. 10, the external loopback configuration is selected. In response, the switch SW1 is closed and the switch SW2 is opened. In addition, the test controller 220 of the ATE 200 further directs the control signal $S_{CTRL}$ through the communication ports 242, 372 to control the testing module board 300, and the communication port 160 of the IC 100 acquires the incoming RF signal $S_{RF\_IN}$ from the testing module board 300.

As illustrated in FIG. 10, the testing module board 300, which is external to the IC 100 and the ATE 200, may comprise an input port 370, a loopback port 374, a control port 372, an output port 376, an adjustable attenuator 320, a switch SW3, and a signal converter 330. In some implementations, a testing load board (not shown) is provided to hold the testing load board 300 and the IC 100 together. The testing load board may comprise an IC socket (not shown) to accept the IC 100 and a module slot (not shown) to hold the testing module board 300 in place during the test. The input port 370 accepts the response RF signal $S_{RF\_OUT}$ from the IC 100. The control port 372 receives the control signal $S_{CTRL}$ from the test controller 220 of the ATE 200 to enable the testing module board 300 to work under the test mode. The control signal $S_{CTRL}$ controls the attenuator 320 and switching of the switch SW3. Specifically, the attenuator 320 receives controls via the control signal $S_{CTRL}$ to adjust the attenuation level to the RF signal $S_{RF\_OUT}$. The switch SW3 is selected by the control signal $S_{CTRL}$ to switch between the signal converter configuration (i.e. through the signal converter 330) and the external loopback configuration (i.e. through the loopback port 374). In the external loopback configuration, the switch SW3 is switched to the loopback port 374, the outgoing RF signal $S_{RF\_OUT}$ from the RF transmitter 120 is attenuated by the attenuator 320 of the testing module board 300, and then output to the LNA 141 of the RF receiver 140 through the loopback port 374 to undergo RF impairments in a receiver path. In other words, the RF transmitter output signal $S_{RF\_OUT}$ is looped back through the attenuator 320 as an input RF signal $S_{RF\_IN}$ to the RF receiver 140 for a further test in the receiver path. In the RF receiver 140, the input RF signal $S_{RF\_IN}$ is down-converted into the baseband, which is digitized into digital words regarded as the evaluation signal $S_{ev1}$ sent to the test analyzer 210 of the ATE 200 for test analysis.

Figure 11:
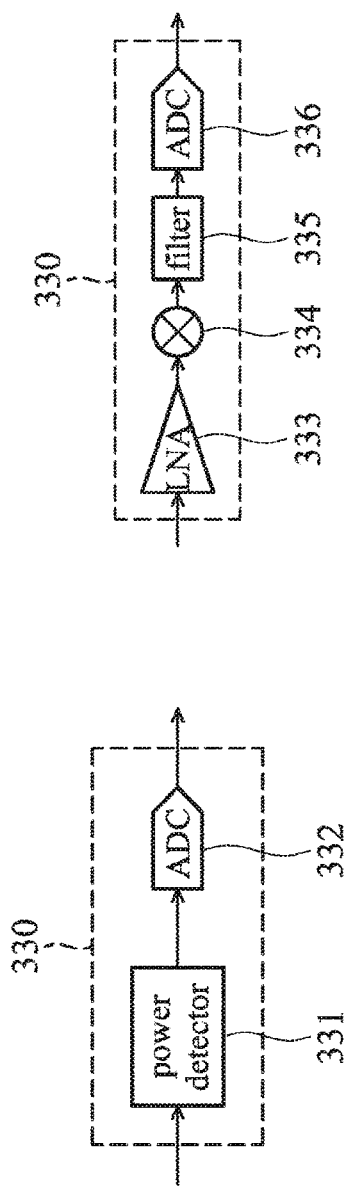
FIGS. 11A-11B are schematic block diagrams of the signal converter 330 according to different embodiments of the invention.
Figure 12:
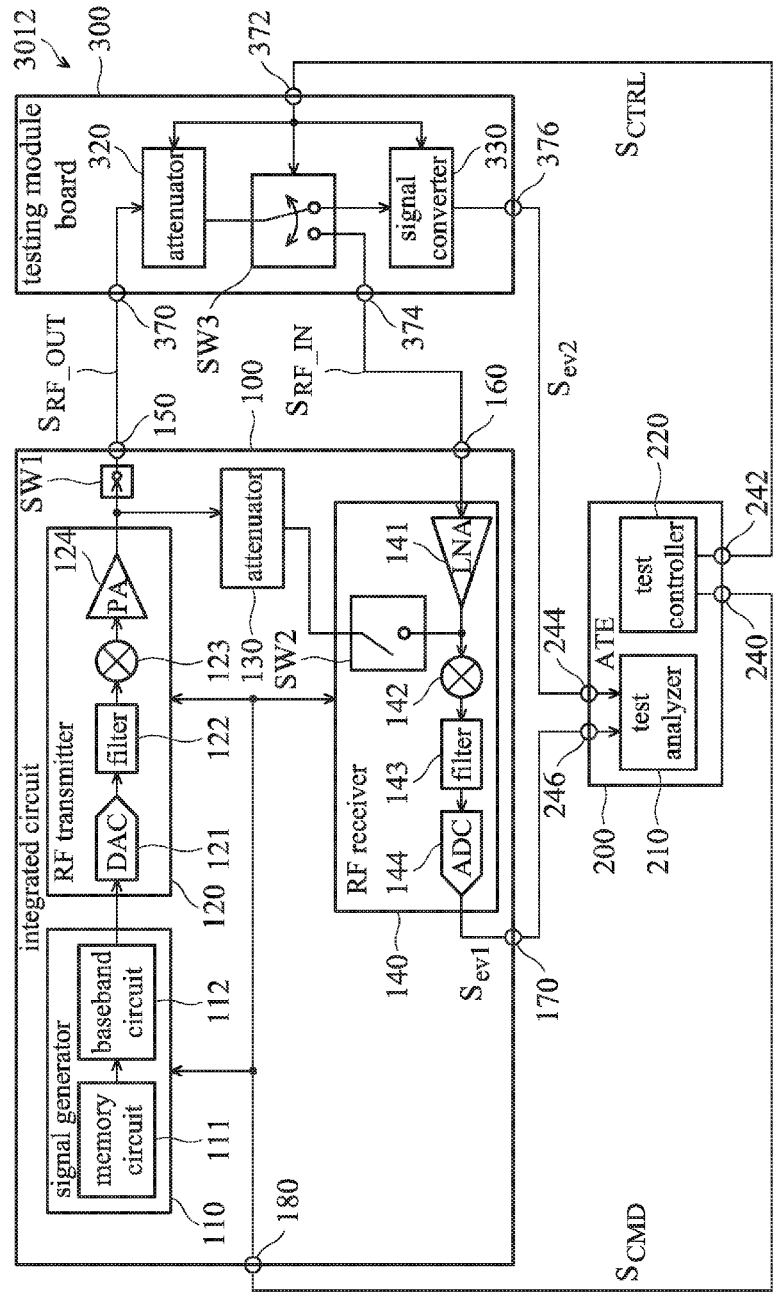
FIG. 12 is a detailed schematic block diagram of the RF testing system 3012 according to yet another embodiment of the invention.

In the signal converter configuration, as shown in FIG. 12, the switch SW3 is switched to the signal converter 330, the outgoing RF signal $S_{RF\_OUT}$ from the RF transmitter 120 is attenuated by the attenuator 320 of the testing module board 300, and then converted by the signal converter 330. In other words, the RF transmitter output signal $S_{RF\_OUT}$ is not looped back to the IC 100, but processed by the testing module board 300 to generate the evaluation signal $S_{ev2}$ sent to the test analyzer 210 of the ATE 200 through ports 374 and 244 for test analysis. FIGS. 11A-11B are schematic block diagrams of the signal converter 330 according to different embodiments of the invention. The signal converter 330 may be implemented in different circuits, thereby converting RF signals into analog/digital signals. For example, the signal converter 330 may comprise a power detector 331 and an ADC 332, as illustrated in FIG. 11A. Alternatively, the signal converter 330 may have similar components, such as an LNA 333, a demodulator 334, a filter 335, and an ADC 336, as those in the RF receiver 140, as illustrated in FIG. 11B. It should be noted that the invention is not limited to the aforementioned implementations of the signal converter 330. For those skilled in the art, it is appreciated that a reference RF receiver can be implemented in various circuits, and the details will not be described here.

It should be noted that the evaluation signals $S_{ev1}$ and $S_{ev2}$ may be in analog or digital form. In some implementations, the RF transmitter 120 and the RF receiver 140 do not have DAC/ADC circuits, and the test analyzer 210 may further comprise a digitizer (not shown) to convert the incoming analog evaluation signals into digital signals, thereby performing digital signal analysis of the RF test process.

In comparison to conventional RF test mechanisms, the present embodiment depicts an RF testing system where signal received/transmitted by the ATE 200 is only low-frequency signals. Only low-frequency command signal $S_{CMD}$ and evaluation signals $S_{ev1}$ are exchanged between the IC 100 and the ATE 200. In addition, only low-frequency control signal $S_{CTRL}$ and evaluation signals $S_{ev2}$ are exchanged between the testing module board 300 and the ATE 200. It should be noted that high-speed communication is only between the IC 100 and the testing module board 300. This leads to a reduction in the circuit complexity of the ATE 200, thereby decreasing design and manufacturing cost.

In view of the above, three configurations, which are the internal loopback configuration, the external loopback configuration, and the signal converter configuration, are provided to test the transmission performance of the IC 100. Upon receiving the evaluation signal $S_{ev1}$ or $S_{ev2}$, a test analysis of the transmission performance of the IC 100 can be performed by the test analyzer 210 of the ATE 200. For example, the transmitter path is usually tested at the system level test by the EVM and spectrum, nonlinearity tests such as IIP2 and IIP3, an image signal test, a carrier leakage test, and a transmission power test.

Figure 13:
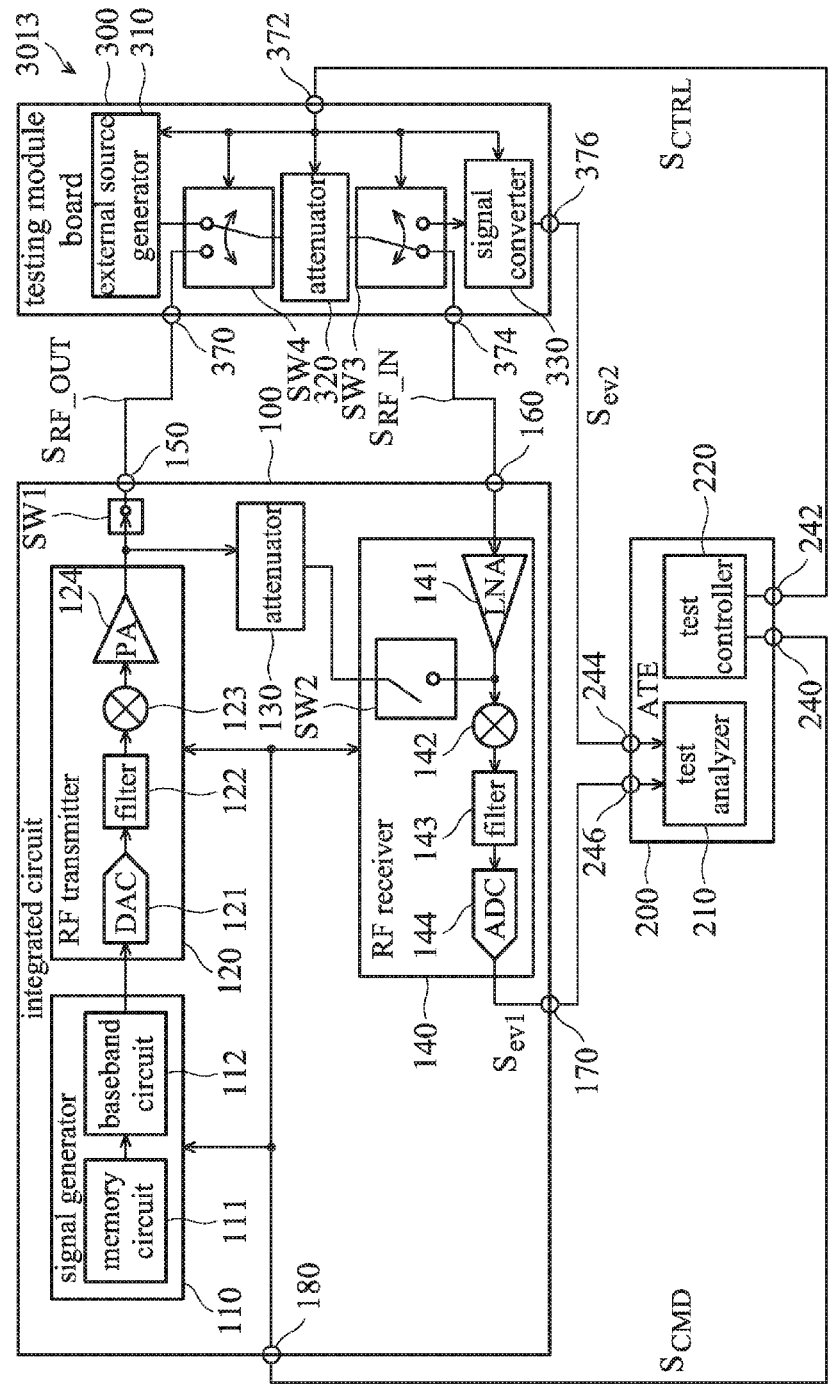
FIG. 13 is a detailed schematic block diagram of the RF testing system 3013 according to still yet another embodiment of the invention.

FIG. 13 is a detailed schematic block diagram of the RF testing system 3013 according to still yet another embodiment of the invention. The circuit configuration and connection is similar to those in the RF testing system 3012, except that in the RF testing system 3013, an external source generator 310 and a switch SW4 are placed at the testing module board 300 for further performing Rx test process. The switch SW4 is controlled by the control signal $S_{CTRL}$ to switch between the incoming RF signals from the RF transmitter 120 or from the external source generator 310. Specifically, referring to FIG. 13, upon receiving the control signal $S_{CTRL}$ indicating initiation of an RF Rx test process, the external source generator 310 may start to generate the single-tone, two-tone, and modulation signals required in the RF Rx test process. Meanwhile, the switch SW4 is switched to the external source generator 310 and the switch SW3 is switched to the communication port 374. In response, the generated signals from the external source generator 310 are fed into the attenuator 320, and then the attenuated RF signals are transmitted to the LNA 141 of the RF receiver 140 via the communication port 374, thereby evaluating the reception performance of the IC 100 in the receiver path at the test analyzer 210. Similarly, the RF receiver 140 may output the first evaluation signal $S_{ev1}$ through the communication port 170 to the test analyzer 210 of the ATE 200 for test analysis. Upon receiving the evaluation signal $S_{ev1}$, a test analysis of the reception performance of the IC 100 can be performed by the test analyzer 210 of the ATE 200. For example, the evaluated characteristics for the receiver path comprise a receiver gain test, an image signal test, a DC offset test, an NF test, and nonlinearity tests such as IIP2 and IIP3.

Figures 14A, 14B, 14C:
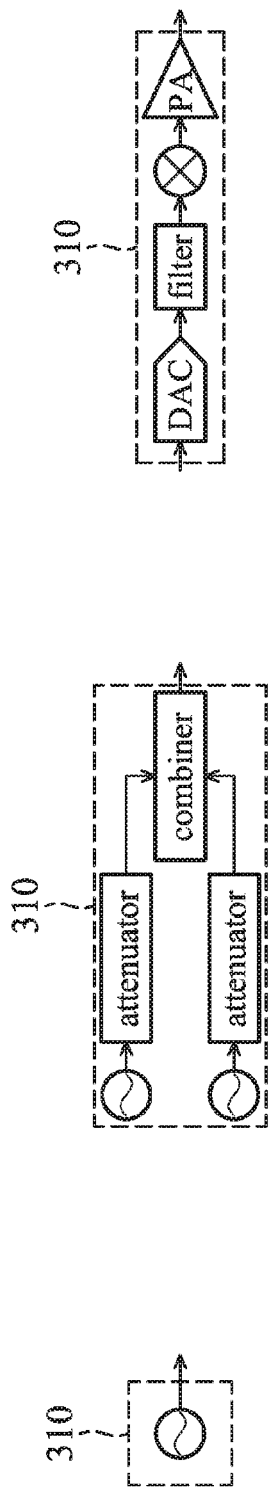
FIG. 14A-14C are block diagrams of the external source generator 310 according to different embodiments of the invention.

FIG. 14A~14C are block diagrams of the external source generator 310 according to different embodiments of the invention. For example, the external source generator 310 may be a single-tone generator, a dual-tone generator, and/or a reference RF transmitter, as illustrated in FIGS. 14A, 14B and 14C, respectively. The DAC in FIG. 14C may be coupled to a test pattern generator not shown, or receive test pattern from the TE 200. Implementations of the signal-tone generator, dual-tone generator, and the reference RF transmitter are well-known to those skilled in the art, and the details will not be described here.

Figure 15:
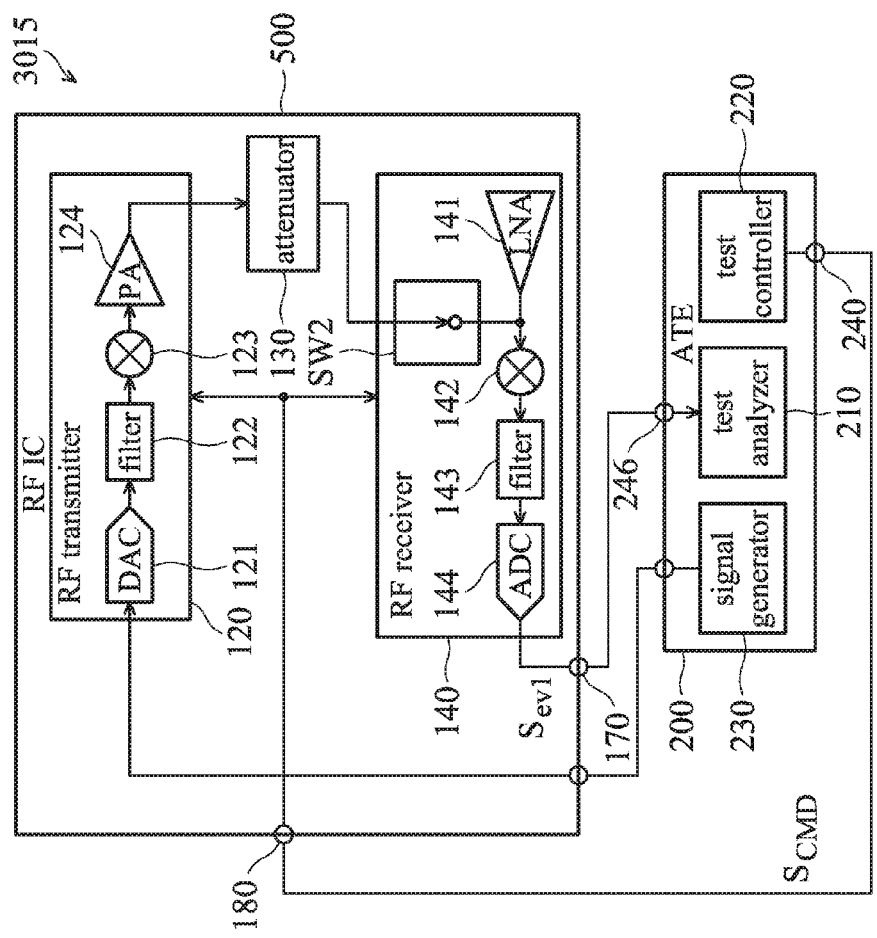
FIG. 15 is a schematic block diagram of an RF testing system 3015 according to an embodiment of the invention.

FIG. 15 is a schematic block diagram of an RF testing system 3015 according to an embodiment of the invention. In the RF testing system 3015, the IC 500 may be a stand-alone RF IC without a signal generator. Accordingly, the function of the signal generator is moved to the ATE 200. In other words, the test controller 220 may control the signal generator 230 internally, thereby transmitting predefined RF test patterns to the RF transmitter 120. The circuit configuration and connection of the remaining components in the RF testing system 3015 are similar to those in the RF testing system 3009, and the details can be referred to in the aforementioned embodiments of FIG. 9. Similar to the embodiment of FIG. 9, the internal loopback configuration is also selected in the RF testing system 3015. Specifically, the RF transmitter 120 receives the external RF test pattern signals from the signal generator 230 of the ATE 200. Then, the outgoing RF signal generated by the RF transmitter 120 may be internally fed back to the RF receiver 140 through the internal attenuator 130. In addition, the evaluation signal $S_{ev1}$ output by the RF receiver 140 can be fed into the test analyzer 210 for test analysis.

Figure 16:
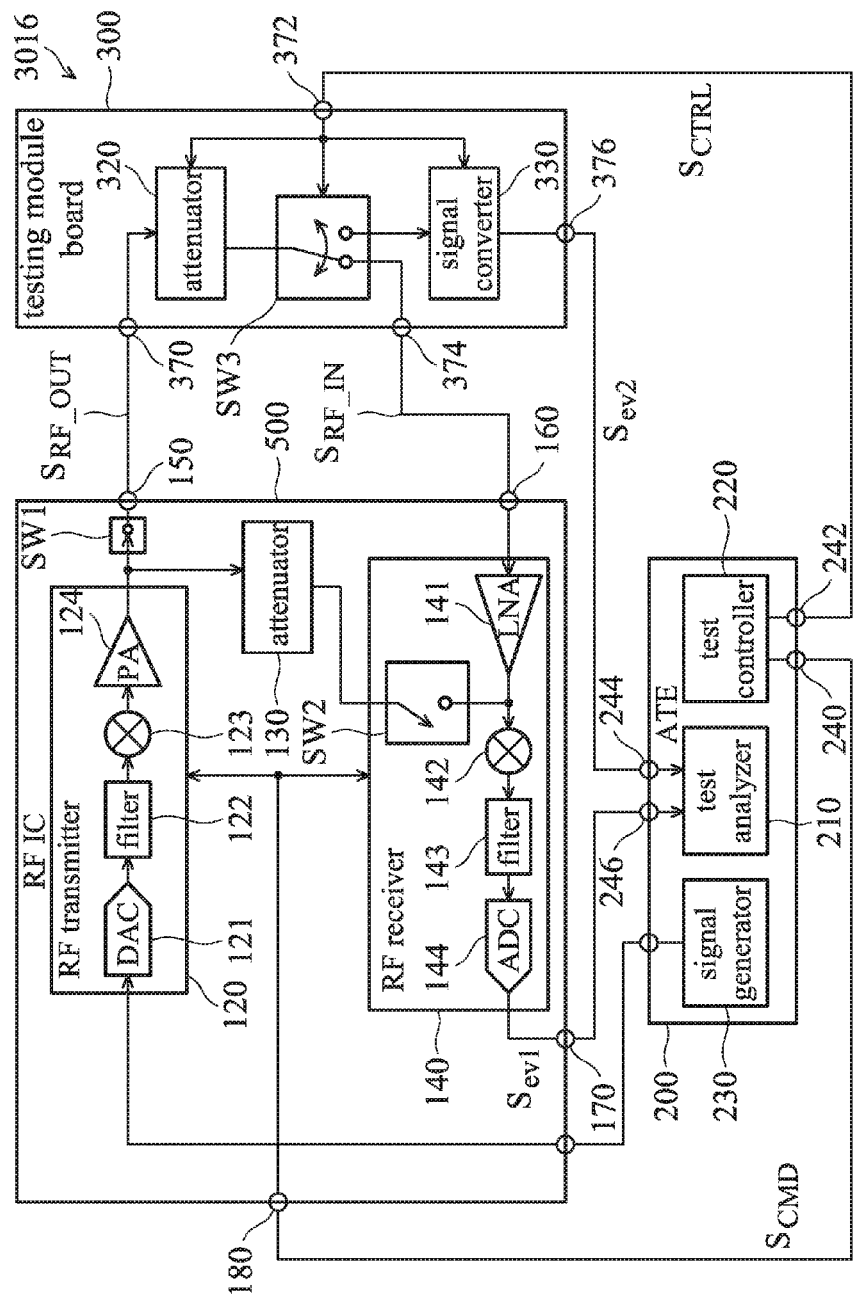
FIG. 16 is a schematic block diagram of an RF testing system 3016 according to another embodiment of the invention.

FIG. 16 is a schematic block diagram of an RF testing system 3016 according to another embodiment of the invention. In the RF testing system 3016, the IC 500 may be a stand-alone RF IC without a signal generator. Accordingly, the function of the signal generator is moved to the ATE 200. In other words, the test controller 220 may control the signal generator 230 internally, thereby transmitting predefined RF test patterns to the RF transmitter 120. The circuit configuration and connection of the remaining components in the RF testing system 3016 are similar to those in the RF testing system 3010, and the details can be referred to in the aforementioned embodiments of FIG. 10. Similar to the embodiment of FIG. 10, the external loopback configuration is also selected in the RF testing system 3016. Specifically, the RF transmitter 120 receives the external RF test pattern signals from the signal generator 230 of the ATE 200 and generates the outgoing RF test signal $S_{RF\_OUT}$. Then, the outgoing RF test signal $S_{RF\_OUT}$ from the RF transmitter 120 is transmitted to the testing module board 300. The RF test signal $S_{RF\_OUT}$ is attenuated by the attenuator 320 in the testing module board 300, and the attenuated RF test signal is further fed back into the RF receiver 140 through the communication port 160. Subsequently, the evaluation signal $S_{ev1}$ output by the RF receiver 140 can be fed into the test analyzer 210 for test analysis.

Figure 17:
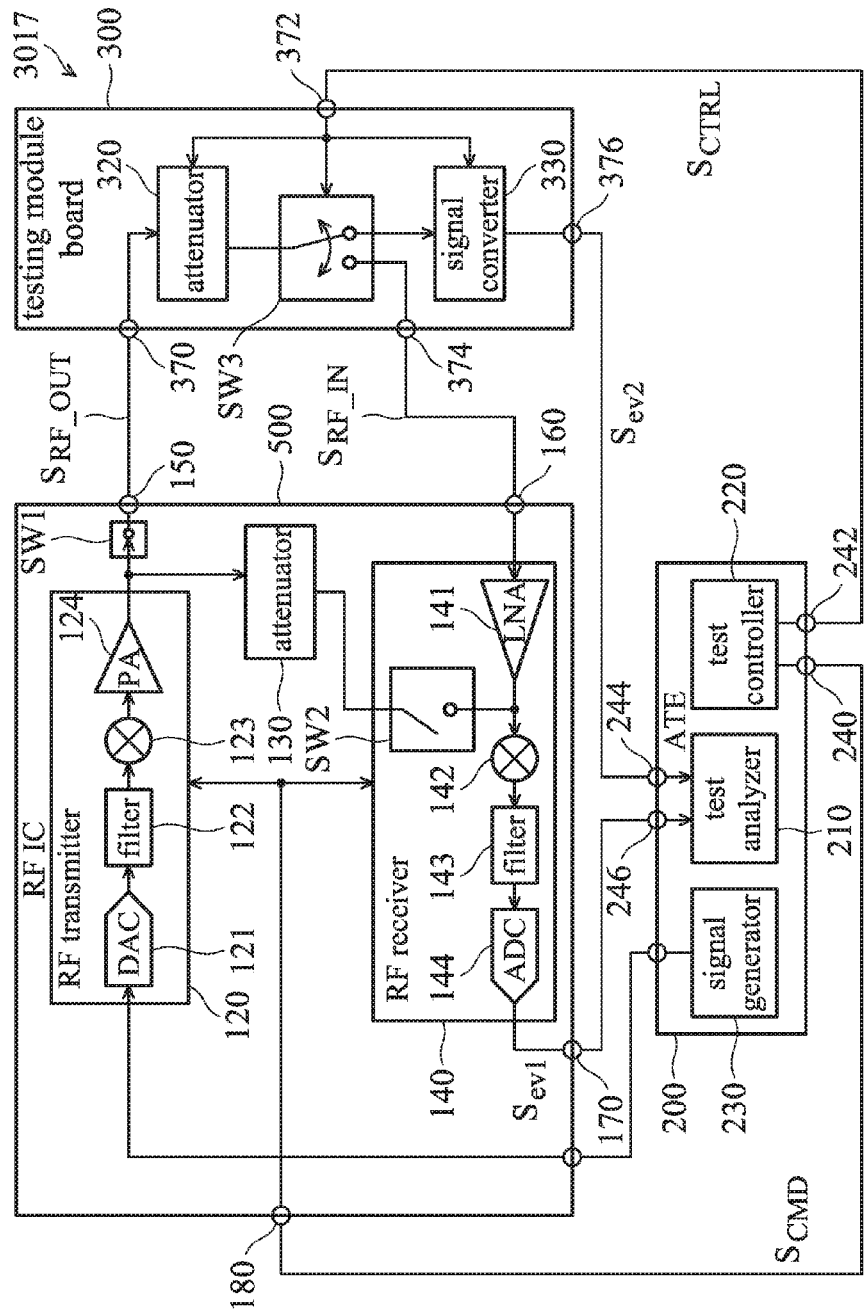
FIG. 17 is a schematic block diagram of an RF testing system 3017 according to yet another embodiment of the invention.

FIG. 17 is a schematic block diagram of an RF testing system 3017 according to yet another embodiment of the invention. In the RF testing system 3017, the IC 500 may be a stand-alone RF IC without a signal generator. Accordingly, the function of the signal generator is moved to the ATE 200. In other words, the test controller 220 may control the signal generator 230 internally, thereby transmitting predefined RF test patterns to the RF transmitter 120. The circuit configuration and connection of the remaining components in the RF testing system 3011 are similar to those in the RF testing system 3012, and the details can be referred to in the aforementioned embodiments of FIG. 12. Similar to the embodiment of FIG. 12, the signal converter configuration is also selected in the RF testing system 3017. Specifically, the RF transmitter 120 receives the external RF test pattern signals from the signal generator 230 of the ATE 200. Then, the outgoing RF test signal $S_{RF\_OUT}$ from the RF transmitter 120 is transmitted to the testing module board 300. The RF test signal $S_{RF\_OUT}$ is attenuated by the attenuator 320 in the testing module board 300, and the attenuated RF test signal is further fed into the signal converter 330 for signal conversion. Subsequently, a second evaluation signal $S_{ev2}$ is generated by the signal converter 330, and is further transmitted to the test analyzer 210 of the ATE 200 through the communication port 376.

Figure 18:
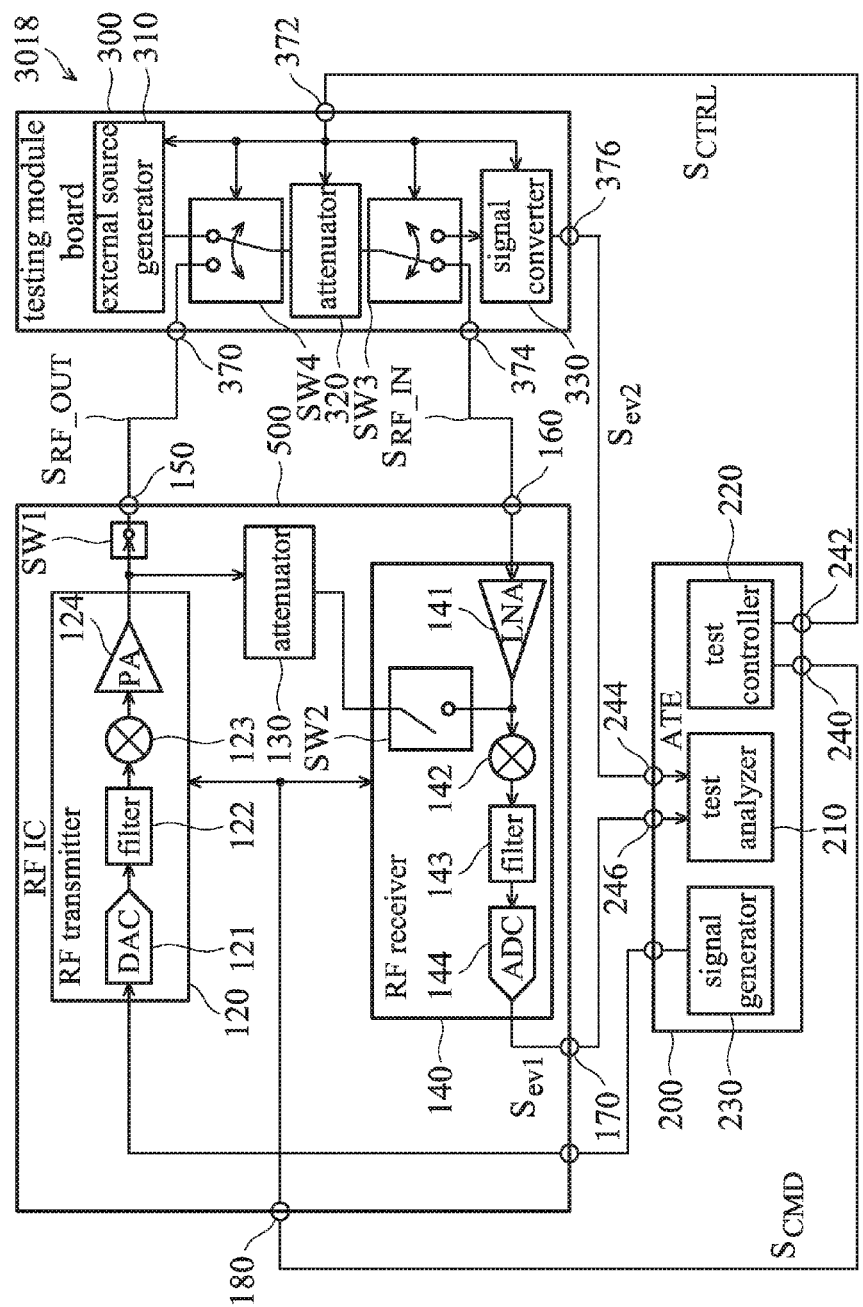
FIG. 18 is a schematic block diagram of an RF testing system 3018 according to still yet another embodiment of the invention.

FIG. 18 is a schematic block diagram of an RF testing system 3018 according to still yet another embodiment of the invention. In the RF testing system 3018, the IC 500 may be a stand-alone RF IC without a signal generator. The circuit configuration and connection of the components in the RF testing system 3018 are similar to those in the RF testing system 3013 except that the signal generator 230 has been moved to the ATE 200, and the details can be referred to in the aforementioned embodiments of FIG. 13. Similar to the RF testing system 3013, the testing module board 300 is controlled by the control signals $S_{CTRL}$ generated by the test controller 220 of the ATE 200. Specifically, upon receiving the control signal $S_{CTRL}$ indicating initiation of an RF Rx test process, the external source generator 310 may start to generate the single-tone, two-tone, and modulation signals required in the RF Rx test process. Meanwhile, the switch SW4 is switched to the external source generator 310 and the switch SW3 is switched to the communication port 374, so that the generated signals from the external source generator 310 may be fed into the attenuator 320, and then the attenuated RF signals can be transmitted to the LNA 141 of the RF receiver 140 via the communication port 374, thereby evaluating the reception performance of the IC 100 in the receiver path at the test analyzer 210. Similarly, the RF receiver 140 may output the first evaluation signal $S_{ev1}$ through the communication port 170 to the test analyzer 210 of the ATE 200 for test analysis. Upon receiving the evaluation signal $S_{ev1}$, a test analysis of the reception performance of the IC 100 can be performed by the test analyzer 210 of the ATE 200.

It should be noted that the evaluation signals $S_{ev1}$ and $S_{ev2}$ may be in analog or digital form. In some implementations, the above-mentioned RF transmitter and RF receiver do not have DAC/ADC circuits, and the test analyzer 210 may further comprise a digitizer (not shown) to convert the incoming analog evaluation signals into digital signals, thereby performing digital signal analysis of the RF test process.

Figure 19:
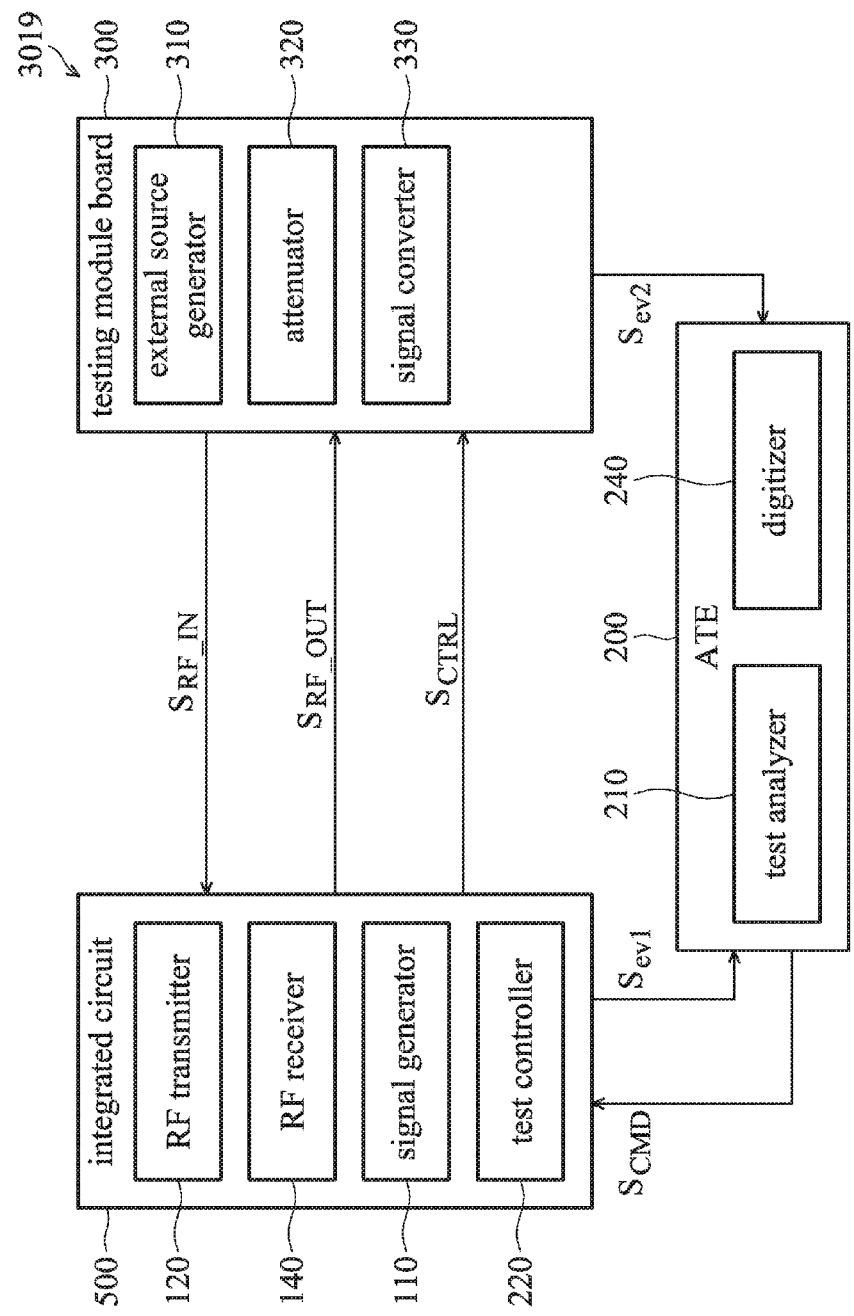
FIG. 19 is a schematic block diagram of an RF testing system 3019 according to still another embodiment of the invention.

FIG. 19 is a schematic block diagram of an RF testing system 3019 according to still another embodiment of the invention. In the RF testing system 3019, the IC 500 may be a SOC or a stand-alone RF IC having a test controller, and the circuit configuration and connection of the components in the RF testing system 3019 are similar to those in the RF testing system 3013 except that the test controller 220 has been moved to the IC 500. In the embodiment, the test analyzer 210 of the ATE 200 is capable of initiating an RF Tx or Rx test process by issuing a command signal (i.e. a digital signal) $S_{CMD}$ to the test controller 220 in the IC 500, and the test controller 220 in the IC 500 may send corresponding control signals $S_{CTRL}$ to the components in the IC 500 and the testing module board 300 in response to the command signal $S_{CMD}$. It should be noted that different RF test configurations, which are previously described in the embodiments of FIGS. 9 to 18, can be used in the RF testing system 3019, and the details can be referred to in the embodiment of FIGS. 9 to 18. Specifically, the test analyzer 210 of the ATE 200 is still responsible for receiving the evaluation signal (i.e. a low-speed analog/digital signal) from either the RF receiver 140 or the signal convertor 330 for digital signal analysis. When the evaluation signal from either the RF receiver 140 or the signal convertor 330 is in an analog form, the digitizer 240 of the ATE 200 may convert the evaluation signal into digital signals before the test analysis is performed by the test analyzer 210.

Figure 20:
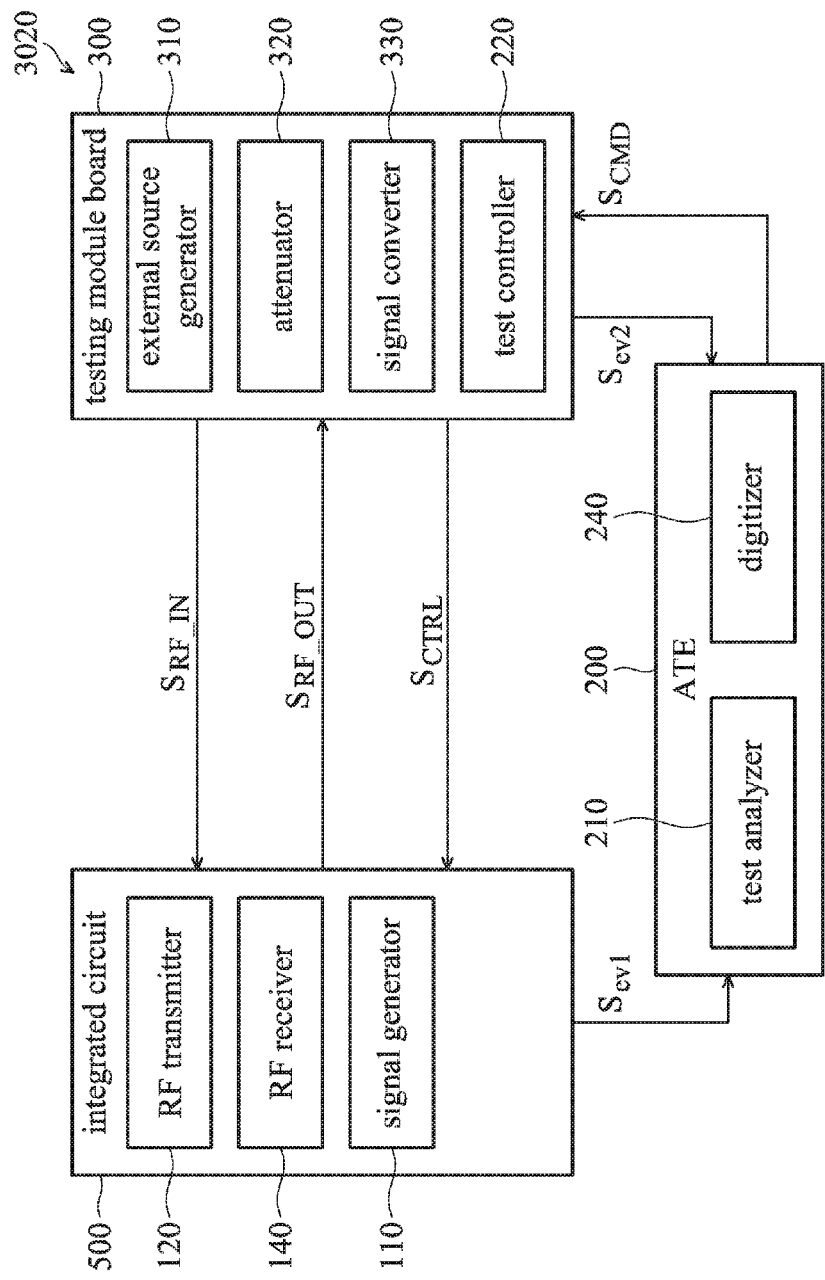
FIG. 20 is a schematic block diagram of an RF testing system 3020 according to still another embodiment of the invention.

FIG. 20 is a schematic block diagram of an RF testing system 3020 according to still another embodiment of the invention. In the RF testing system 3020, the IC 500 may be a SOC or a stand-alone RF IC, and the circuit configuration and connection of the components in the RF testing system 3020 are similar to those in the RF testing system 3013 except that the test controller 220 has been moved to the testing module board 300. In the embodiment, the ATE 200 is capable of initiating an RF Tx or Rx test process by issuing a command signal (i.e. a digital signal) $S_{CMD}$ to the test controller 220 in the testing module board 300, and the test controller 220 in the testing module board 300 may send the control signals $S_{CTRL}$ to the corresponding components in the IC 500 and the testing module board 300 in response to the command signal $S_{CMD}$. It should be noted that different RF test configurations, which are previously described in the embodiments of FIGS. 9 to 18, can be used in the RF testing system 3020, and the details can be referred to in the embodiment of FIGS. 9 to 18. Specifically, the test analyzer 210 of the ATE 200 is still responsible for receiving the evaluation signal (i.e. a low-speed analog/digital signal) from either the RF receiver 140 or the signal convertor 330 for digital signal analysis. When the evaluation signal from either the RF receiver 140 or the signal convertor 330 is in analog form, the digitizer 240 of the ATE 200 may convert the evaluation signal into digital signals before the test analysis is performed by the test analyzer 210.

Figure 21:
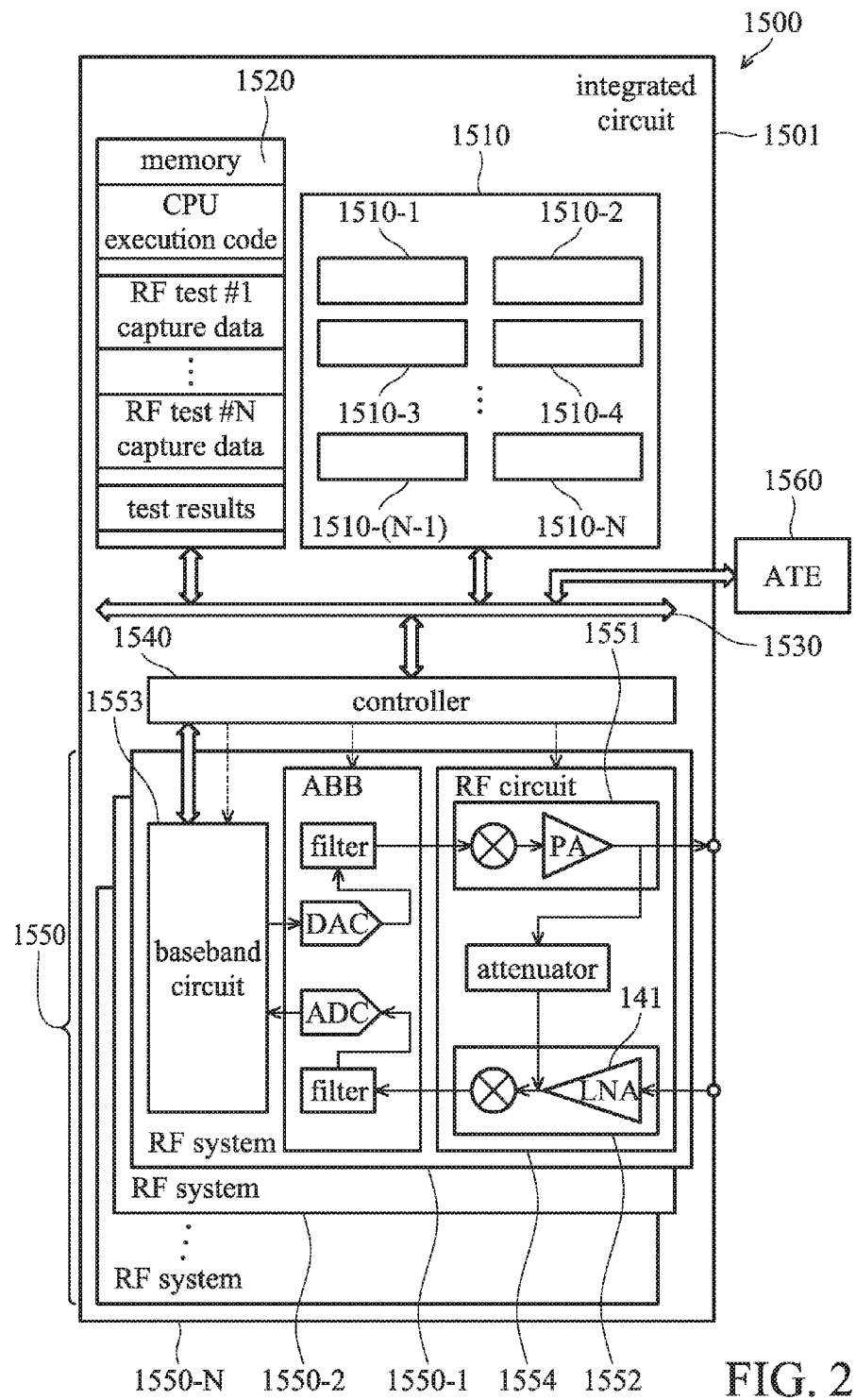
FIG. 21 is a schematic block diagram of an RF testing system 1500 according to an embodiment of the invention.

As more and more RF functions (such as 4G, LTE, 3G, 2G, WiFi, and Bluetooth) and processors (e.g. CPU, GPU, or DSP) have been integrated into an integrated circuit, the present invention further provides an embodiment of an RF testing system that can save test time by utilizing multiple processors (or multiple processing units, such as a multi-core processor) in the integrated circuit efficiently. FIG. 21 is a schematic block diagram of an RF testing system 1500 according to an embodiment of the invention. The RF testing system 1500 comprises an integrated circuit 1501 and an ATE 1560. The components in the integrated circuit 1501 of the RF testing system 1500 communicate with each other through the system bus 1530. For example, the integrated circuit 1501 comprises a processor 1510, a memory unit 1520, a system bus 1530, a controller 1540, one or more RF systems 1550 (including RF systems 1550-1~1550-N). In an embodiment, the processor 1510 comprises a plurality of processing cores that are capable of executing a specific task (e.g. a test procedure) in parallel or executing different tasks concurrently. Alternatively, the processor 1510 may comprise a plurality of central processing units (CPUs), graphics processing units (GPUs), digital signal processors (DSPs), or a combination thereof. The memory unit 1520 may be a volatile memory such as a static random access memory (SRAM) or a dynamic random access memory (DRAM), but the invention is not limited thereto. The controller 1540 is a unified built-in self-test (BIST) controller that communicates with each of the RF systems 1550. Each of the RF systems 1550-1~1550-N is compliant with a specific wireless communications protocol such as 2G, 3G, 4G/LTE, Wifi, Bluetooth, etc, but the invention is not limited thereto. For example, the RF system 1550-1 comprises a baseband circuit 1553, an ABB circuit, and an RF circuit 1554. The RF circuit 1554 comprises an RF transmitter 1551, an RF receiver 1552, and an attenuator, and details of the components in the RF circuit 1554 can be referred to in the aforementioned embodiments.

Figure 23:
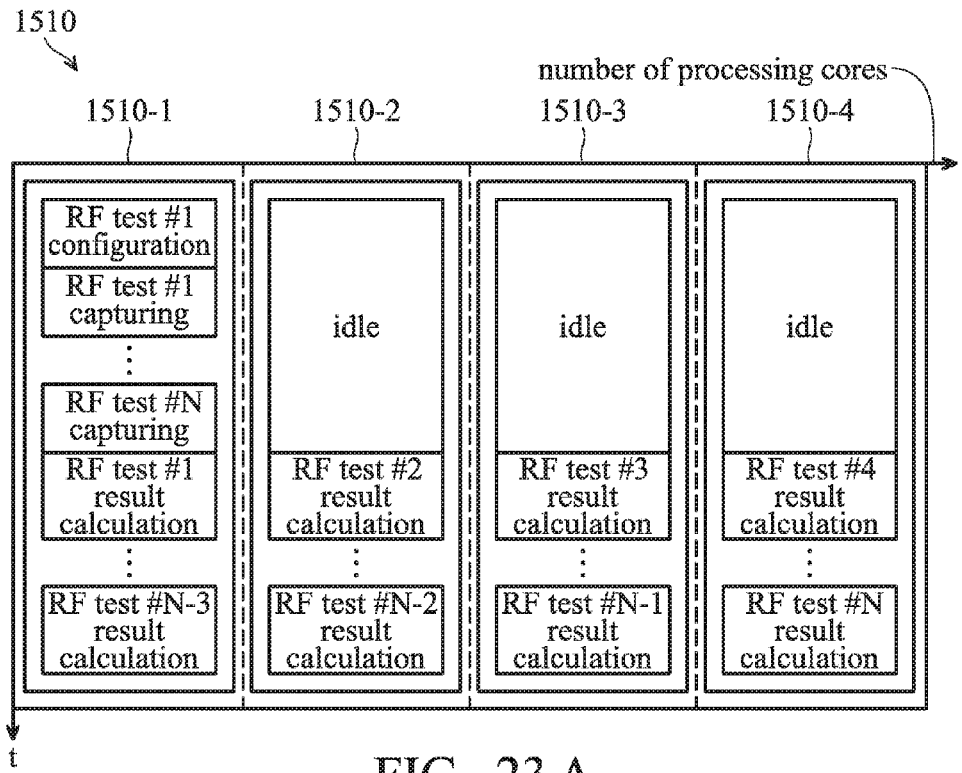
FIG. 23A is a diagram of a multi-core execution flow for the RF test in accordance with an embodiment of the invention.
FIG. 23B is a diagram of the memory allocation of the captured data of different RF tests of an RF system in accordance with an embodiment of the invention.
Figure 23:
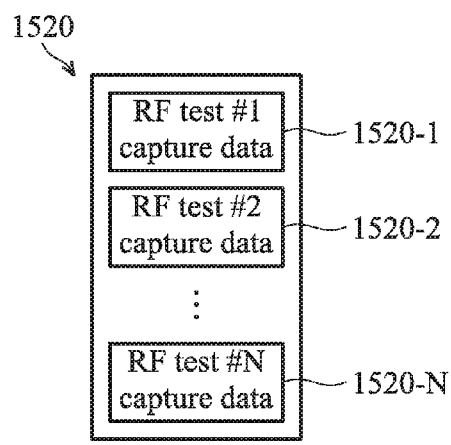

For example, the ATE 1560 stores test patterns for each of the RF systems 1550-1~1550-N, and the ATE 1560 may upload the test patterns to the memory unit 1520 (e.g., "CPU execution code") through the system bus 1530. The MCU system 1510 may control the RF systems 1550 via the controller 1540 associated with CPU execution code. The controller 1540 may retrieve the commands associated with each RF system 1550 from the MCU system 1510 through the system bus 1530, and each RF system 1550 may perform its individual RF testing procedure to generate or receive test data based on the test patterns. For example, the baseband circuit 1553 in the RF system 1550-1 may modulate or directly transmit the test pattern, and then the RF transmitter 1551 in the RF system 1550-1 may generate RF test signals. The associated RF receiver 1552 in the RF system 1550-1 receives the RF test signals from the RF transmitter 1551 through a loopback path, where the details for the loopback path can be found in the aforementioned embodiments. The baseband circuit 1553 in the RF system 1550-1 will capture the test signal in the test loop from the RF receiver 1552 and transmit the captured data (e.g., "RF test #1 capture data") to the memory unit 1520 through the controller 1540 and system bus 1530. The processor 1510 may analyze the RF test #1 capture data to determine the signal quality and record this determination (e.g., "test results") in the memory 1520. Accordingly, the test result can be obtained from the memory unit 1520 by the ATE 1560. The details for the processor 1510 execution flow will be introduced later in the embodiments of FIGS. 23-25.

It should be noted that the components 1510~1550 can be integrated into an integrated circuit 1501 (e.g. a system-on-chip) that can be used in an electronic device, and the ATE 1560 is external to the integrated circuit 1501.

Figure 22:
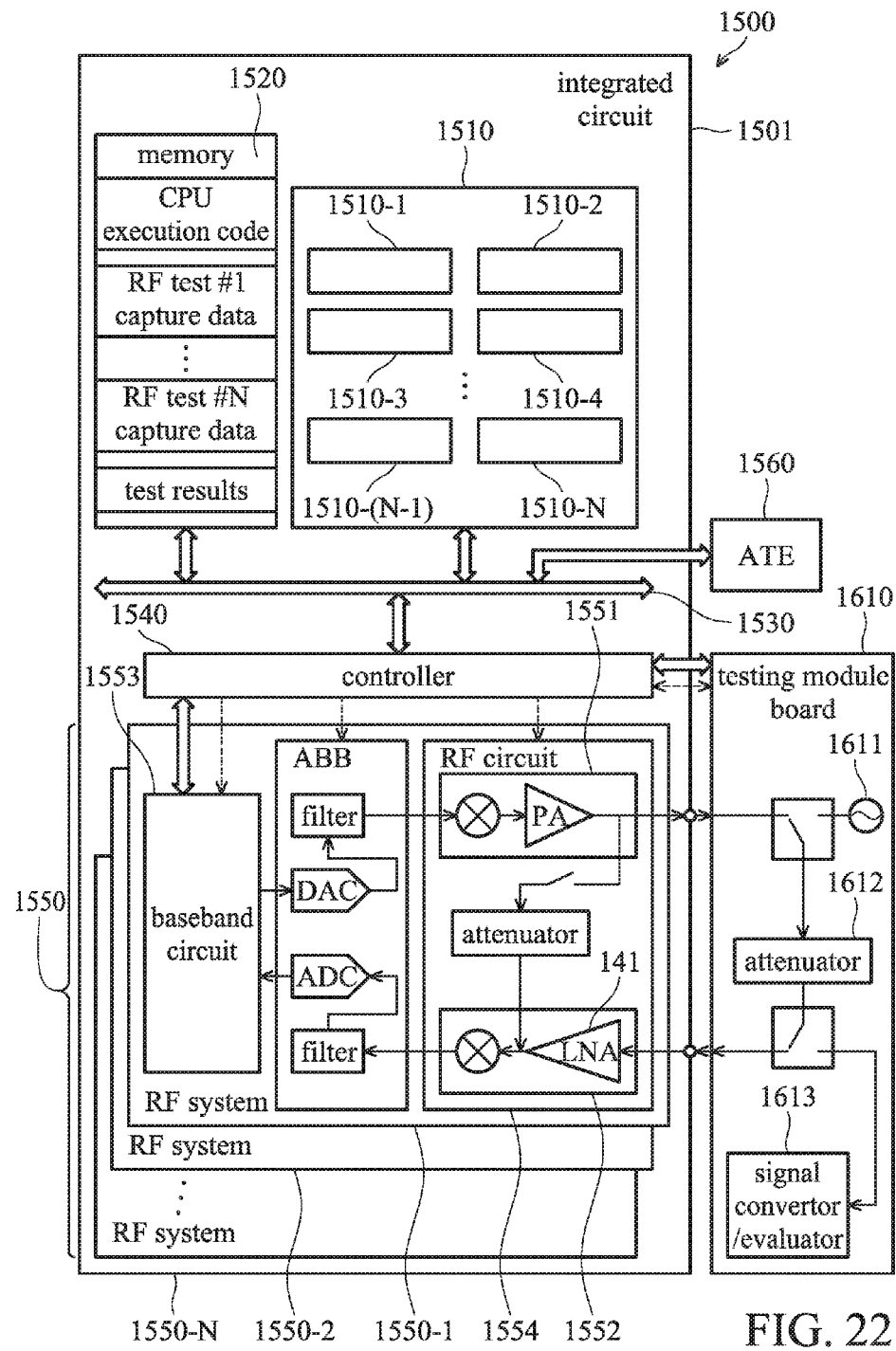
FIG. 22 is a schematic block diagram of the RF testing system 1500 according to another embodiment of the invention.

FIG. 22 is a schematic block diagram of the RF testing system 1500 according to another embodiment of the invention. In another embodiment, the RF testing procedures for the RF testing system 1500 can be performed with an external testing module board 1610. For example, the RF system 1550-1 is to be tested, and the RF system 1550-1 can be connected to the external testing module board 1610. The testing module board 1610 comprises a signal generator 1611, an attenuator 1612, and a signal converter 1613. The components and operations of the testing module board 1610 are similar to those of the testing module board 300 described in the embodiments of FIGS. 3-14. For example, the testing module board 1610 can be used to perform the RF Tx testing process through the external loopback path, and the outgoing RF signal from the RF transmitter 1551 is attenuated by the attenuator 1612 of the testing module board 1610, and then output to the LNA 141 of the RF receiver 1552 to undergo RF impairments in a receiver path. In other words, the RF transmitter output signal is looped back through the attenuator 1612 as an input RF signal to the RF receiver 1552 for a further test in the receiver path. In the RF receiver 1552, the input RF signal is down-converted into an analog baseband signal, which is digitized into digital words. The baseband circuit 1553 will capture the test signal in the test loop from the RF receiver 1552 and transmit the captured data (e.g., "RF test #1 capture data") to the memory unit 1520 through the controller 1540 and system bus 1530. The processor 1510 may analyze the RF test #1 capture data to determine the signal quality and record this determination (e.g., "test results") in the memory 1520. Accordingly, the test result can be obtained from the memory unit 1520 by the ATE 1560. The details for the processor 1510 execution flow will be introduced later in the embodiments of FIGS. 23-25.

The signal converter and evaluator 1613 of the testing module board 1610 may down-convert the outgoing RF signal of the RF transmitter 1551 into a baseband signal, digitize the baseband signal into digital data (e.g. using an ADC), and stores the digital data into the memory 1520 (e.g., "RF test #1 capture data") through the controller 1540 and system bus 1530. The processor 1510 may analyze the RF test #1 capture data to determine the signal quality and record this determination (e.g., "test results") in the memory 1520. Accordingly, the test result can be obtained from the memory unit 1520 by the ATE 1560. The details for the processor 1510 execution flow will be introduced later in the embodiments of FIGS. 23-25.

When the testing module board 1610 is used to perform the RF Rx testing process, the signal generator 1611 generates an RF test signal that is received by the RF receiver 1552. The baseband circuit 1553 in the RF system 1550-1 will capture the test signal in the test loop from the RF receiver 1552 and transmit the captured signal (e.g., "RF test #1 capture data") to the memory unit 1520 through the controller 1540 and system bus 1530. The processor 1510 may analyze the RF test #1 capture data to determine the signal quality and record this determination (e.g., "test results") in the memory 1520. Accordingly, the test result can be obtained from the memory unit 1520 by the ATE 1560. The details for the processor 1510 execution flow will be introduced later in the embodiments of FIGS. 23-25. In other embodiments, the testing module board 1610 may further include ADC, filter and power detector, etc., depending on the test requirements.

FIG. 23A is a diagram of a multi-core execution flow for the RF test in accordance with an embodiment of the invention. FIG. 23B is a diagram of the memory allocation of the captured data of different RF tests of an RF system in accordance with an embodiment of the invention. The processing cores in the processor 1510 can be utilized to analyze the captured test data for each RF system 1550 in parallel. For example, given that the processor 1510 has four processing cores 1510-1, 1510-2, 1510-3, and 1510-4, as shown in FIG. 23A, the processing core 1510-1 may firstly execute test flow control for test item #1~#N. Each test flow control includes RF system 1550 test configuration setup (RF test #n configuration) and capturing data to be stored to the memory 1520 (RF test #n capturing). The test flow control of each RF test may access the same controller 1540 or RF system 1550. The multi-core execution flow FIG. 23A shows the test flow control is executed sequentially. When all the test control flow is executed, the captured data of different RF tests are stored separately in the memory unit 1520. For example, the captured data for RF tests #1~#N are stored in the memory space 1520-1~1520-N, respectively, as shown in FIG. 23B. In this embodiment, the processing core 1510-1 is in charge of controlling whole test flow and loading all the captured data of different RF tests to the memory 1520, which are shown as "RF test #1 configuration"→"RF test #1 capturing"~"RF test #N configuration"→"RF test #N capturing" in FIG. 17A. However, this should not be a limitation of the present invention. For example, each of the processing cores 1510-1~1510-4 may load the captured data of different RF tests, or each processing cores 1510-1~1510-4 may also load a portion of the captured data to the memory 1520. In this embodiment, the captured data for RF tests #1, #2, #3, and #4 are calculated and analyzed by the processing cores 1510-1, 1510-2, 1510-3, and 1510-4, respectively. Upon completing the RF tests #1, #2, #3, and #4, the captured data for RF tests #5, #6, #7, #8 are calculated and analyzed by the processing cores 1510-1, 1510-2, 1510-3, and 1510-4, respectively. Similarly, the captured data for RF tests #N-3, #N-2, #N-1, and #N are calculated and analyzed by the processing cores 1510-1, 1510-2, 1510-3, and 1510-4, respectively. In other words, the four processing cores 1510-1~1510-4 may analyze the captured data for four different RF tests in parallel. As a result, the loading of calculation/analysis of RF tests is shared between the plurality of processing cores, thus increasing the test flow efficiency and reducing test time.

In some embodiments, the assignment for analyzing the captured data depends on the workload of each processing core. For example, it may take a much longer time to analyze the captured data of the RF test #1 by the processing cores 1510-1 while it takes less time to analyze the captured data of the RF tests #2, #3, and #4 by the processing cores 1510-2, 1510-3, and 1510-4, respectively. Upon completion of the RF tests #2, #3 and #4, the processing cores 1510-2, 1510-3, and 1510-4 may analyze the captured data of the RF tests #5, #6, and #7, respectively.

In some embodiments, if it may take very long time to analyze the captured data of a specific RF test, the task for analyzing the captured data can be distributed to the processing cores 1510-1~1510-4 for parallel multi-core execution.

It should be noted that the number of processing cores in the processor 1510 in the aforementioned embodiments is for the purpose of description, and a different number of processing cores in the processor can also be applied in the aforementioned embodiments. Additionally, the processor 1510 may comprise a plurality of central processing units (CPUs), graphics processing units (GPUs), and/or digital signal processors (DSPs), that are capable of performing multi-processor execution to analyze the captured data of different RF tests simultaneously, or analyze the captured data of a specific RF test in parallel.

Figure 24:
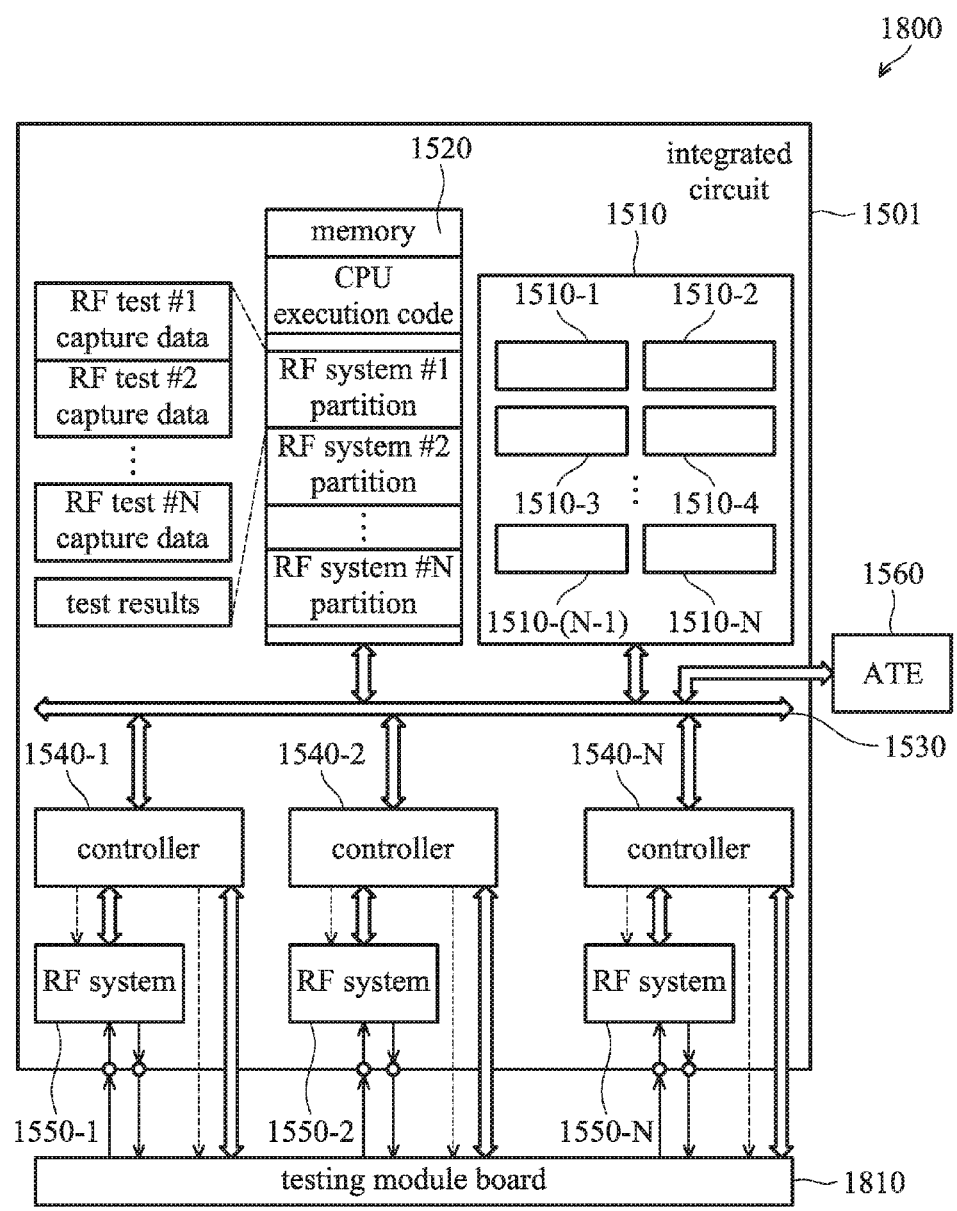
FIG. 24 is a schematic block diagram of the RF testing system 1800 according to yet another embodiment of the invention.
Figure 25:
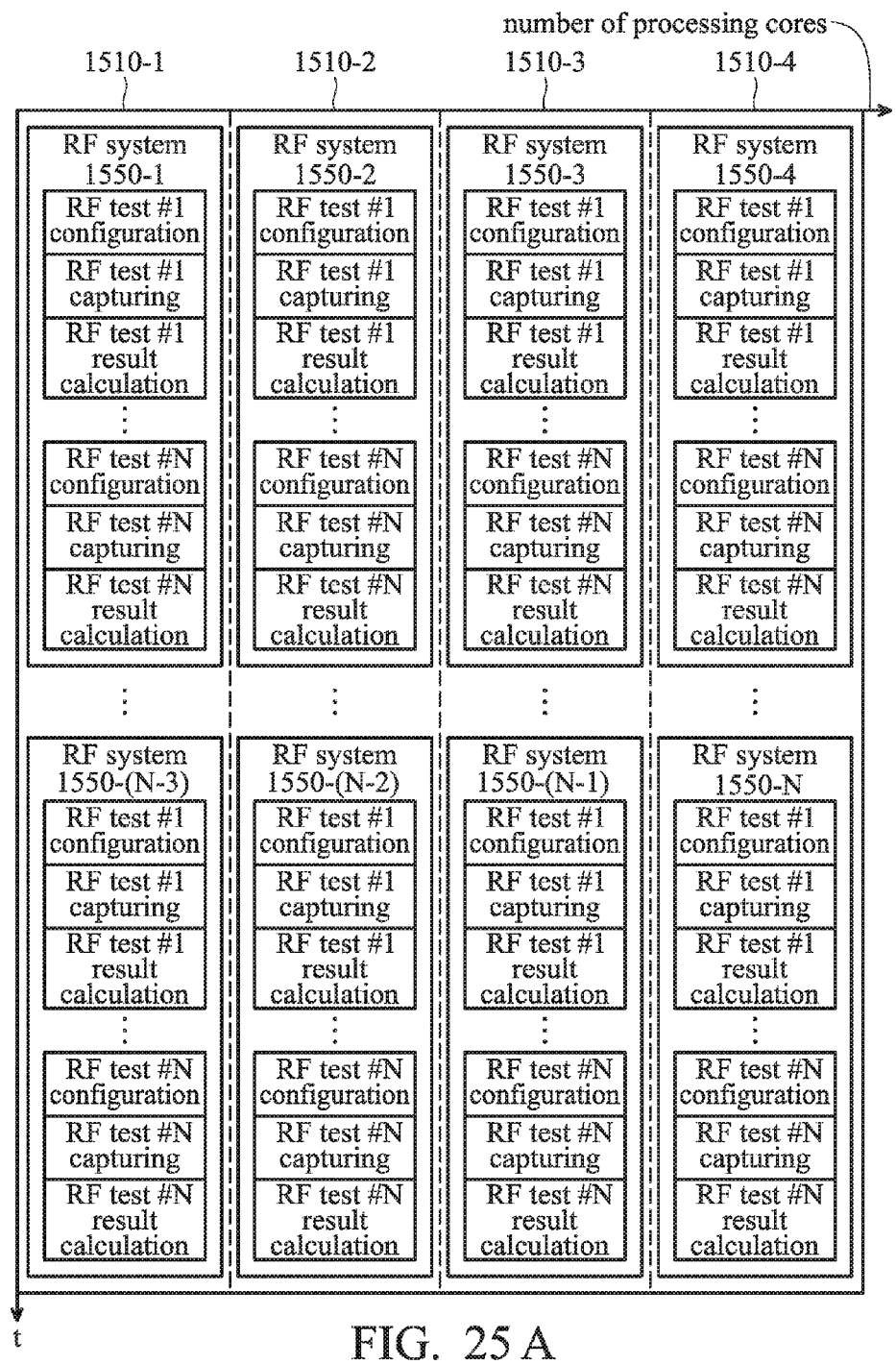
FIG. 25A is a diagram of a multi-core execution flow for the RF test in accordance with another embodiment of the invention.
FIG. 25B is a diagram of the memory allocation of the captured data of different RF system in accordance with another embodiment of the invention.
Figure 25:
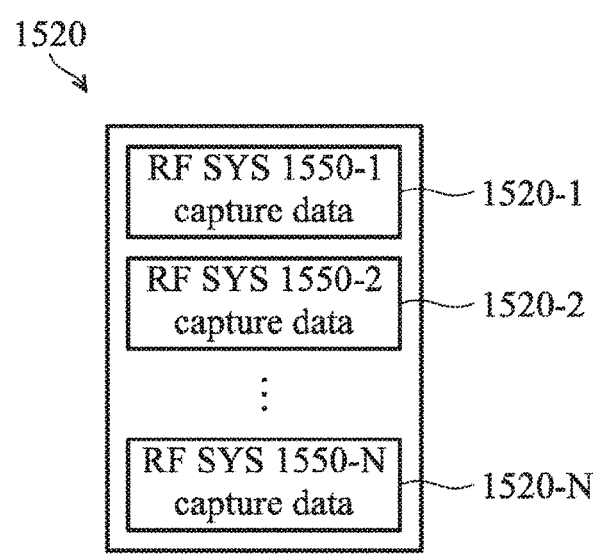

FIG. 24 is a schematic block diagram of the RF testing system 1800 according to yet another embodiment of the invention. The differences between the RF testing systems 1500 and 1800 are that each RF system has an individual BIST controller that is connected to the system bus 1530. For example, the controllers 1540-1~1540-N correspond to the RF systems 1550-1~1550-N, respectively. In addition, each of the RF systems is connected to the testing module board 1810 that is capable of performing an external loopback configuration of the RF test, and the details can be referred to in the aforementioned embodiments.

FIG. 25A is a diagram of a multi-core execution flow for the RF test in accordance with another embodiment of the invention. FIG. 25B is a diagram of the memory allocation of the captured data of different RF system in accordance with another embodiment of the invention. Referring to FIG. 24 and FIG. 25B, in another embodiment, each of the RF systems has its own partition (i.e. memory space) in the memory unit 1520. For example, each partition (e.g. 1520-1~1520-N) may record the captured data for different RF tests and test results of an individual RF system. The analysis for different RF tests of each RF system is performed by different processing cores 1510-1~1510-N of the processor 1510. For example, the analysis of the RF tests #1~#N of the RF systems 1550-1, 1550-2, 1550-3, and 1550-4 are performed by the processing cores 1510-1, 1510-2, 1510-3, and 1510-4, respectively.

Specifically, the processing core 1510-1 may load the configuration for RF test #1 of the RF system 1550-1 and perform data capturing and result calculation, and then load the configuration for RF test #2 of the RF system 1550-1 and perform data capturing and result calculation until the analysis of the RF test #N of the RF system 1550-1 is completed. Meanwhile, the processing core 1510-2 may load the configuration for each RF test of the RF system 1550-2 one by one and perform data capturing and result calculation until the analysis of the RF test #N of the RF system 1550-2 is completed. The processing cores 1510-3 and 1510-4 may load configuration for each RF test of the RF systems 1550-3 and 1550-4 and perform data capturing and result calculation until the analysis of the RF test #N of the RF systems 1550-3 and 1550-4 are completed, respectively. Similarly, the processing cores 1510-1~1510-4 may load the configuration of the RF tests and perform data capturing and result calculation of the RF systems 1550-(N−3), 1550-(N−2), 1550-(N−1), and 1550-N, respectively. In this way, the loading of calculation/analysis of RF tests of RF systems is shared between the plurality of processing cores, thus increasing the test flow efficiency and reducing test time. More particularly, all of the plurality of processing cores could process the RF tests of RF systems simultaneously (fully parallel-processing), thus increasing the test flow efficiency and reducing test time.

It should be noted that the number of processing cores in the processor 1510 in the aforementioned embodiments is for the purpose of description, and a different number of processing cores in the processor can also be applied in the aforementioned embodiments. Additionally, the processor 1510 may comprise a plurality of central processing units (CPUs), graphics processing units (GPUs), and/or digital signal processors (DSPs), that are capable of performing multi-processor execution to analyze the captured data of different RF tests simultaneously, or analyze the captured data of a specific RF test in parallel.

While the invention has been described by way of example and in terms of the preferred embodiments, it is to be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. An integrated circuit (IC), comprising:
   an RF system configured to perform an RF transmission to transmit an RF signal or to perform an RF reception to receive an RF signal when the IC enters a test mode; and
   a computation unit having a plurality of processing units that are parallelized to perform a test procedure to determine one or more test results corresponding to the RF transmission or RF reception.

2. The IC as claimed in claim 1, wherein the processing units are processing cores of a processor.

3. The IC as claimed in claim 1, wherein the processing units are central processing units (CPU), graphics processing units (GPU), digital signal processors (DSP), or a combination thereof.

4. The IC as claimed in claim 1, wherein the processing cores are parallelized to perform the test procedure of a specific RF test.

5. The IC as claimed in claim 4, wherein assignment of the processing cores to perform the test procedure of different RF tests corresponds to workloads and execution time of the processing cores.

6. The IC as claimed in claim 1, wherein each of the processing cores is assigned to perform the test procedure of different RF tests.

7. The IC as claimed in claim 1, further comprising a test controller configured to control the RF system in response to a command signal from test equipment that is external to the IC.

8. The IC as claimed in claim 1, wherein the IC is a system-on-chip (SOC).

9. An integrated circuit (IC), comprising:
   a computation unit having a plurality of processing units; and
   a plurality of RF systems, wherein each RF system is configured to perform an RF transmission to transmit an RF signal or to perform an RF reception to receive an RF signal when the IC enters a test mode
wherein the processing units of the computation unit are parallelized to perform one or more test procedures of the RF systems to determine one or more test results of the RF systems.

10. The IC as claimed in claim 9, wherein the processing units are processing cores of a processor.

11. The IC as claimed in claim 9, wherein the processing units are central processing units (CPU), graphics processing units (GPU), digital signal processors (DSP), or a combination thereof.

12. The IC as claimed in claim 9, wherein the processing cores are parallelized to perform the test procedures of different RF tests the same RF system.

13. The IC as claimed in claim 9, wherein the processing cores are assigned to perform the test procedures of RF tests of different RF systems.

14. The IC as claimed in claim 9, wherein assignment of the processing cores to perform the test procedure of different RF tests corresponds to workloads and execution time of the processing cores.

15. The IC as claimed in claim 9, further comprising: a controller configured to control the RF systems in response to a command signal from the computation unit.

16. The IC as claimed in claim 9, further comprising: a plurality of controllers, wherein each controller is configured to set a respective RF system to enter a test mode in response to a command from the computation unit.

17. The IC as claimed in claim 16, wherein each of the RF systems is connected to module circuitry that is external to the IC, wherein the module circuitry is configured to generate RF test signals to each RF system or detect the RF signal from each RF system.

18. A radio frequency (RF) testing system, comprising:
an integrated circuit, comprising:
a computation unit having a plurality of processing units; and
a plurality of RF systems, wherein each RF system is configured to perform an RF transmission to transmit an RF signal or to perform an RF reception to receive an RF signal when the IC enters a test mode and
module circuitry, configured to generate RF test signals to the RF systems or detect the RF signals from the RF systems,
wherein the processing units of the computation unit are parallelized to perform one or more test procedures of the RF systems to determine one or more test results of the RF systems.

\* \* \* \* \*